(12) United States Patent
Pesavento et al.

(10) Patent No.: US 7,221,596 B2
(45) Date of Patent: May 22, 2007

(54) PFET NONVOLATILE MEMORY

(75) Inventors: Alberto Pesavento, Seattle, WA (US); Frédéric J. Bernard, Fuveau (FR); John D. Hyde, Corvallis, OR (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 10/839,985

(22) Filed: May 5, 2004

(65) Prior Publication Data

US 2005/0063235 A1 Mar. 24, 2005

Related U.S. Application Data

(63) Continuation-in-part of application No. 10/437,262, filed on May 12, 2003, now Pat. No. 6,950,342, which is a continuation-in-part of application No. 10/190,337, filed on Jul. 5, 2002, now abandoned.

(51) Int. Cl.
G11C 16/06 (2006.01)

(52) U.S. Cl. .......................... 365/185.21; 365/185.18; 365/185.14; 365/185.28

(58) Field of Classification Search ........... 365/185.21, 365/185.18, 185.14, 185.28
See application file for complete search history.

(56) References Cited

U.S. PATENT DOCUMENTS

| | | | |
|---|---|---|---|
| 4,935,702 A | | 6/1990 | Mead et al. |
| 5,068,622 A | | 11/1991 | Mead et al. |
| 5,272,368 A | * | 12/1993 | Turner et al. ............. 365/185.1 |
| 5,430,670 A | * | 7/1995 | Rosenthal .................... 365/45 |
| 5,438,542 A | | 8/1995 | Atsumi et al. |
| 5,463,348 A | | 10/1995 | Sarpeshkar et al. |

(Continued)

FOREIGN PATENT DOCUMENTS

EP 0 298 618 1/1989

(Continued)

OTHER PUBLICATIONS

Carley, "Trimming Analog Circuits Using Floating-Gate Analog MOS Memory", IEEE Journal of Solid-State Circuits, vol. 24, No. 6, Dec. 1989.

(Continued)

Primary Examiner—David Lam
(74) Attorney, Agent, or Firm—Thelen Reid Brown Raysman & Steiner LLP; David B. Ritchie

(57) ABSTRACT

A nonvolatile memory cell is constructed using a floating-gate (FG) pFET Readout Transistor (RT) having its source tied to a power source (Vdd) and its drain providing a current which can be sensed to determine a cell state. The gate of the RT provides for charge/information storage. A control capacitor structure (CCS) having terminals coupled to a first voltage source and the FG and a tunneling capacitor structure (TCS) having terminals coupled to a second voltage source and the FG are utilized in each embodiment. The CCS has much more capacitance than the TCS. Manipulation of the voltages applied to the first voltage source and second voltage source (and Vdd) controls an electric field across the CCS and pFET dielectrics and thus Fowler-Nordheim tunneling of electrons onto and off of the FG, thus controlling the charge on the FG and the information stored thereon.

129 Claims, 16 Drawing Sheets

U.S. PATENT DOCUMENTS

| | | |
|---|---|---|
| 5,517,044 A | 5/1996 | Koyama |
| 5,541,878 A | 7/1996 | LeMoncheck et al. |
| 5,596,524 A | 1/1997 | Lin et al. |
| 5,617,358 A | 4/1997 | Kodama |
| 5,627,392 A | 5/1997 | Diorio et al. |
| 5,633,518 A | 5/1997 | Broze |
| 5,666,307 A | 9/1997 | Chang |
| 5,687,118 A | 11/1997 | Chang |
| 5,691,939 A | 11/1997 | Chang et al. |
| 5,706,227 A | 1/1998 | Chang et al. |
| 5,717,636 A | 2/1998 | Dallabora et al. |
| 5,736,764 A | 4/1998 | Chang |
| 5,761,121 A | 6/1998 | Chang |
| 5,777,361 A | 7/1998 | Parris et al. |
| 5,790,060 A | 8/1998 | Tesch |
| 5,796,656 A | 8/1998 | Kowshik et al. |
| 5,798,967 A | 8/1998 | Sarin et al. |
| 5,801,994 A | 9/1998 | Chang et al. |
| 5,825,063 A | 10/1998 | Diorio et al. |
| 5,841,165 A | 11/1998 | Chang et al. |
| 5,844,300 A | 12/1998 | Alavi et al. |
| 5,886,566 A * | 3/1999 | Park et al. .................. 327/536 |
| 5,898,613 A | 4/1999 | Diorio et al. |
| 5,901,084 A | 5/1999 | Ohnakado |
| 5,912,842 A | 6/1999 | Chang et al. |
| 5,939,945 A | 8/1999 | Thewes et al. |
| 5,966,329 A | 10/1999 | Hsu et al. |
| 5,969,987 A | 10/1999 | Blyth et al. |
| 5,972,804 A | 10/1999 | Tobin et al. |
| 5,982,669 A | 11/1999 | Kalnitsky |
| 5,990,512 A | 11/1999 | Diorio et al. |
| 6,028,789 A | 2/2000 | Mehta et al. |
| 6,055,185 A | 4/2000 | Kalnitsky et al. |
| 6,081,451 A | 6/2000 | Kalnitsky et al. |
| 6,125,053 A | 9/2000 | Diorio et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,144,581 A | 11/2000 | Diorio et al. |
| 6,166,954 A | 12/2000 | Chern |
| 6,166,978 A | 12/2000 | Goto |
| 6,190,968 B1 | 2/2001 | Kalnitsky et al. |
| 6,208,557 B1 | 3/2001 | Bergemont et al. |
| 6,294,427 B1 | 9/2001 | Furuhata et al. |
| 6,320,788 B1 | 11/2001 | Sansbury et al. |
| 6,452,835 B1 | 9/2002 | Diorio et al. |
| 6,469,937 B2 | 10/2002 | Fuchigami et al. |
| 6,479,863 B2 | 11/2002 | Caywood |
| 6,534,816 B1 | 3/2003 | Caywood |
| 6,563,731 B1 | 5/2003 | Bergemont |
| 6,611,463 B1 * | 8/2003 | Mehta et al. ........... 365/185.28 |
| 6,646,919 B1 | 11/2003 | Madurawe et al. |
| 6,678,190 B2 | 1/2004 | Yang et al. |
| 6,853,583 B2 * | 2/2005 | Diorio et al. ......... 365/185.21 |
| 2002/0008271 A1 | 1/2002 | Hsu et al. |
| 2003/0206437 A1 | 11/2003 | Diorio et al. |
| 2004/0004861 A1 | 1/2004 | Srinivas et al. |
| 2004/0021166 A1 | 2/2004 | Hyde et al. |
| 2004/0037127 A1 | 2/2004 | Lindhorst et al. |
| 2004/0052113 A1 | 3/2004 | Diorio et al. |
| 2004/0195593 A1 | 10/2004 | Diorio et al. |

FOREIGN PATENT DOCUMENTS

| | | |
|---|---|---|
| EP | 0 776 049 | 5/1997 |
| EP | 0 778 623 | 7/2001 |

OTHER PUBLICATIONS

Chung, et al., "N-Channel Versus P-Channel Flash EEPROM-Which One Has Better Reliabilities", IEEE Annual International Reliability, 2001, pp. 67-72.

Diorio, et al., "A Floating-Gate MOS Learning Array with Locally Computed Weight Updates", IEEE Transactions on Electron Devices, vol. 44, No. 12, Dec. 1997, pp. 1-10.

Diorio, et al., "A High-Resolution Non-Volatile Analog Memory Cell", IEEE Intl. Symp. on Circuits and Systems, vol. 3, 1995, pp. 2233-2236.

Herdt, et al., "Analysis, Measurement, and Simulation of Dynamic Write Inhibit in an nvSRAM Cell", IEEE Transactions on Electron Devices, vol. 39, No. 5, May 1992, pp. 1191-1196.

Vittoz, et al., "Dynamic Analog Techniques", Design of Analog-Digital VLSI Circuits for Telecommunications and Signal Processing, Chapter 4, Second Edition, 1994, pp. 97-124.

Ying Shi, et al., "Polarity Dependent Gate Tunneling Currents in Dual-Gate CMOSFET's", IEEE Transactions on Electron Devices, vol. 45, No. 11, Nov. 1998, pp. 2355-2360.

Partial International Search for International Application No. PCT/US03/31792, date mailed Apr. 2, 2004.

Chang, et al., "A CMOS-Compatible Single-Poly Cell for Use as Non-Volatile Memory", International Semiconductor Device Date Research Symposium, Dec. 1-3, 1999, pp. 50-57.

Chang, et al., "Non-Volatile Memory Device with True CMOS Compatibility", Electronics Letters, vol. 35, No. 17, Aug. 19, 1999, pp. 1443-1445.

Diorio, "A p-Channel MOS Synapse Transistor with Self-Convergent Memory Writes", IEEE Transaction On Electron Devices, vol. 47, No. 2, pp. 464-472, Feb. 2000.

Usuki, Tatsuya, et al., "Direct Tunneling Memory: Trade-off Between Nonvolatility and High-Endurance with Low Voltage Operations", Nonvolatile Semiconductor Workshop Symposium, Aug. 12, 2001; pp. 80-81.

Jaroslav Raszka et al., "Embedded Flash Memory for Security Applications in a 0.13 um CMOS Logic Process", IEEE International Solid-State Circuits Conference, 2004, pp. 46-47.

Invitation to Pay Additional Fees, for application PCT/US2005/015606, mailed Nov. 18, 2005.

The International Search Report for International application No. PCT/US2005/015606, date of mailing Feb. 24, 2006.

* cited by examiner

Hysteresis by Addition

Hysteresis by Subtraction

Hysteresis by Addition

| STATE | TUN | REN | RSB | D1 | D0 | FG1 | FG0 |
|---|---|---|---|---|---|---|---|
| READ0 | 0 | VDD | 0 | 0 | 0 | 1 | -1 |
| READ1 | 0 | VDD | 0 | 0 | 0 | -1 | 1 |
| READ IGNORE | 0 | VDD | VDD | 0 | 0 | X | X |
| WRITE0 | 10 | 0 | 5 | 0 | 10 | 1 | -1 |
| WRITE1 | 10 | 0 | 5 | 10 | 0 | -1 | 1 |
| WRITE IGNORE | 5 | 5 | 5 | X | X | No Change | |

| STATE | TUN | REN | RSB | D1 | D0 | FG1 | FG0 | WELL |
|---|---|---|---|---|---|---|---|---|
| READ0 | 0 | VDD | 0 | 0 | 0 | 1 | -1 | VDD |
| READ1 | 0 | VDD | 0 | 0 | 0 | -1 | 1 | VDD |
| READ IGNORE | 0 | VDD | VDD | 0 | 0 | X | X | VDD |
| WRITE0 | 10 | 0 | 5 | 0 | 10 | 1 | -1 | 0 |
| WRITE1 | 10 | 0 | 5 | 10 | 0 | -1 | 1 | 0 |
| WRITE IGNORE | 5 | 5 | 5 | X | X | No Change | | 5 |

PFET NONVOLATILE MEMORY

STATEMENT OF RELATED CASES

This application is a continuation-in-part of U.S. patent application Ser. No. 10/437,262, filed May 12, 2003, now U.S. Pat. No. 6,950,342 in the name of inventors Chad A. Lindhorst, Christopher J. Diorio, Troy N. Gilliland, Alberto Pesavento, Shail Srinivas, Yan Jun Ma, Terry Hass and Kambiz Rahimi, entitled "Differential Floating-Gate Nonvolatile Memories", which is, in turn, a continuation-in-part of U.S. patent application Ser. No. 10/190,337, filed Jul. 5, 2002, now abandoned in the name of inventors Shail Srinivas, Chad A. Lindhorst, Yan Jun Ma, Terry Hass, Kambiz Rahimi and Christopher J. Diorio, entitled "Differential EEPROM Using pFET Floating Gate Transistors", all commonly assigned herewith.

FIELD OF THE INVENTION

The present invention relates generally to nonvolatile memory. More particularly, the present invention relates to single-ended and differential-type nonvolatile memory using floating-gate p-channel field effect transistors (pFETs) to store information as electric charge.

BACKGROUND OF THE INVENTION

Nonvolatile memory (NVM) is an important form of memory in today's electronic circuits. NVM is used to store serial number information, security information, settings, parameters, computer instructions (firmware), and the like. Reprogrammable NVM is particularly important, particularly in the field of tags such as RFID (radio frequency identification) tags which store information inexpensively and can be can be remotely sensed without the need to complete an actual circuit with the RFID tag itself. Such tags lack their own power supply and are powered instead by current rectified from a scanner's read-carrier RF signal received from an RFID reader/scanner.

SUMMARY OF THE INVENTION

A nonvolatile memory cell is constructed using a floating-gate pFET readout transistor having its source tied to a power source (Vdd) and its drain providing a current, which can be sensed to determine the state of the cell. The gate of the pFET readout transistor provides for charge storage which can be used to represent information such as binary bits. A control capacitor structure having its first terminal coupled to a first voltage source and its second terminal coupled to the floating gate and a tunneling capacitor structure having its first terminal coupled to a second voltage source and its second terminal coupled to the floating gate are utilized in each embodiment. The control capacitor structure may be fabricated so that it has much more capacitance than does the tunneling capacitor structure (and assorted stray capacitance between the floating gate and various other nodes of the cell). Manipulation of the voltages applied to the first voltage source and second voltage source (and Vdd) controls an electric field across the capacitor structure and pFET dielectrics and thus Fowler-Nordheim tunneling of electrons onto and off of the floating gate, thus controlling the charge on the floating gate and the information value stored thereon. Both single-ended and differential memory cells are implemented. Hysteresis circuits may also be provided to provide additional write margin. Arrays of such nonvolatile memory cells are also implemented.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1A:
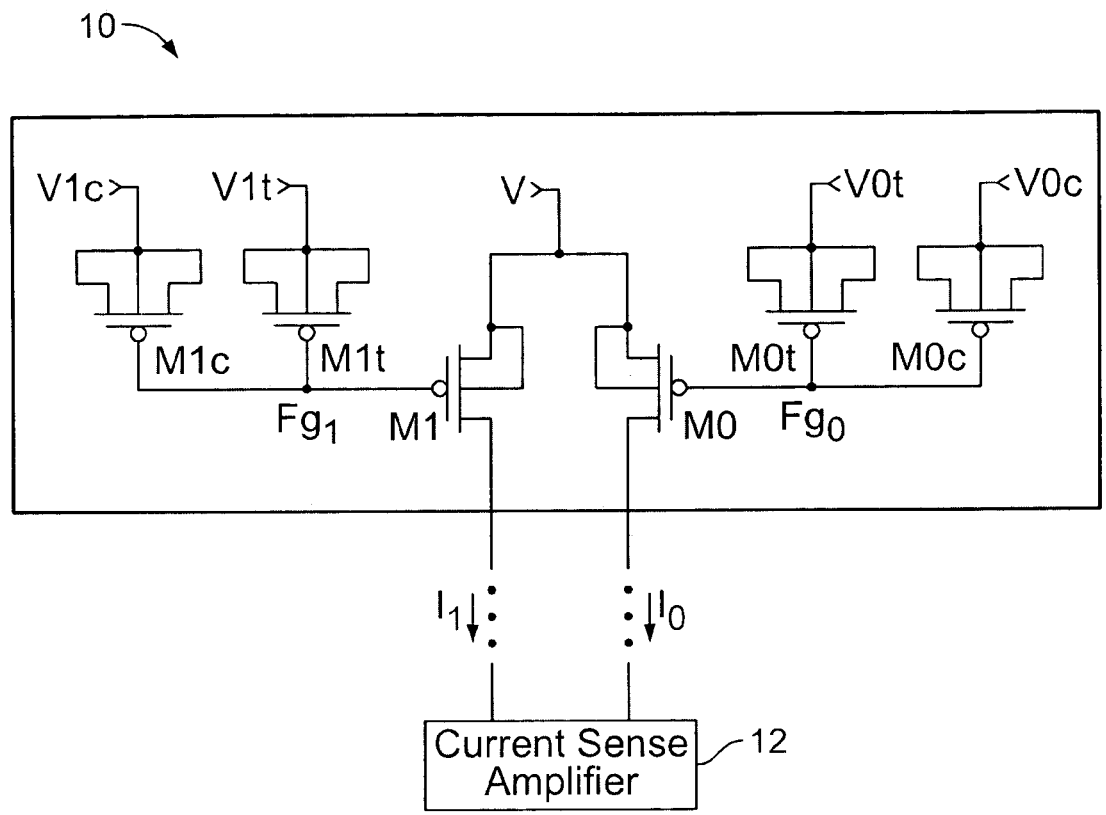
FIG. 1A is an electrical schematic diagram illustrating an embodiment of a basic differential pFET NVM memory cell 10 in accordance with an embodiment of the present invention.

Embodiments of the present invention described in the following detailed description are directed at floating-gate nonvolatile memory cells having pFET readout transistors. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter for p− wells and a doping level on the order of $10^{15}$ atoms per cubic centimeter for p− substrate material. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

A number of circuits that may be used as NVM cells and arrays for such cells are described in detail below. These NVM circuits are able to store information by modifying a charge (i.e., by adding or removing electrons) stored on a floating gate of one or more pFET transistors. In digital implementations of the invention, the state (i.e., either a "1" or a "0") of the memory cell is read by measuring the current of some of the pFETs in the circuit. The use of pFETs instead of nFETs (n-channel FETs) offers better data retention, higher endurance and requires no additional processing steps beyond what is available in standard logic CMOS processes. Obviously, if desired, these circuits can be fabricated in as complicated a process as desired, however, they are all capable of being fabricated in single-poly (single layer of polysilicon) logic CMOS processes as supported by virtually all semiconductor foundries operating today. Conventional FLASH and EEPROM NVM require special process steps beyond those of logic CMOS and are, consequently, harder and more expensive to fabricate. Applications that require up to several kilobytes of NVM on the same chip with other circuitry and/or require low cost fabrication are ideal candidates for the circuits discussed herein.

Turning now to FIG. 1A, a basic differential pFET NVM memory cell 10 is illustrated. This cell has two floating gates denoted $Fg_0$ and $Fg_1$. By storing a different amount of electrons on the two floating gates it is possible to establish a voltage differential between the two floating gates. When the NVM cell is powered, through the terminal denoted "V", a difference in the readout currents $I_0$ and $I_1$ is present and a sense amplifier such as a conventional current sense amplifier 12 can consequently be used to discern the logic value stored in the cell. For example, the condition $I_0 > I_1$ may be used to signify the logic value "0" and the condition $I_0 < I_1$ may be used to signify the logic value "1".

As shown in FIG. 1A, transistors M1, M1t and M1c have floating gate $Fg_1$ in common. Transistors M0, M0t and M0c have floating gate $Fg_0$ in common. V1c is the voltage terminal for transistor M1c; V1t is the voltage terminal for transistor M1t; V is the voltage terminal for transistors M1 and M0; V0t is the voltage terminal for transistor M0t; and V0c is the voltage terminal for transistor M0c. As can be seen M1c, M1t, M0t and M0c in accordance with this illustrated embodiment may all be shorted pFETs in that their source, drain and well connections are all tied together as shown. The voltage terminals referred to above are therefore connected to the respective source, drain and well of the shorted pFETs. M1c, M1t, M0t and M0c may also be constructed as other types of transistors, such as nFETs. M1c and M0c, which are used as control capacitors, may also be constructed as poly-poly, or poly-metal capacitors. Metal-metal capacitors can also be used for the control capacitor structures, although with existing fabrication processes this would reduce the memory retention time due to leakage from the poly contact and the metal inter-layer dielectric. By applying the appropriate voltages to terminals V01, V0t, V1c, V1t and V, a sufficiently large electric field can be established across the oxide dielectric of any of the three pFETs connected to each floating gate $Fg_0$, $Fg_1$ so that the well-known mechanism of Fowler-Nordheim (FN) tunneling may be used to pass electrons through the oxide dielectric of the selected transistor.

Figure 1B:
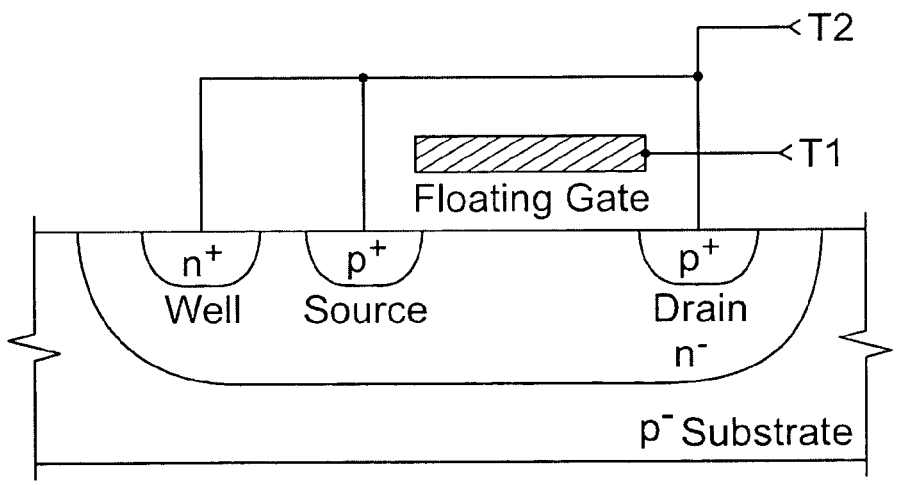
FIG. 1B is a side elevational diagram of a well-source-drain shorted pFET as used in some embodiments of the present invention for the control capacitor structure and the tunneling transistor structure.
Figure 1C:
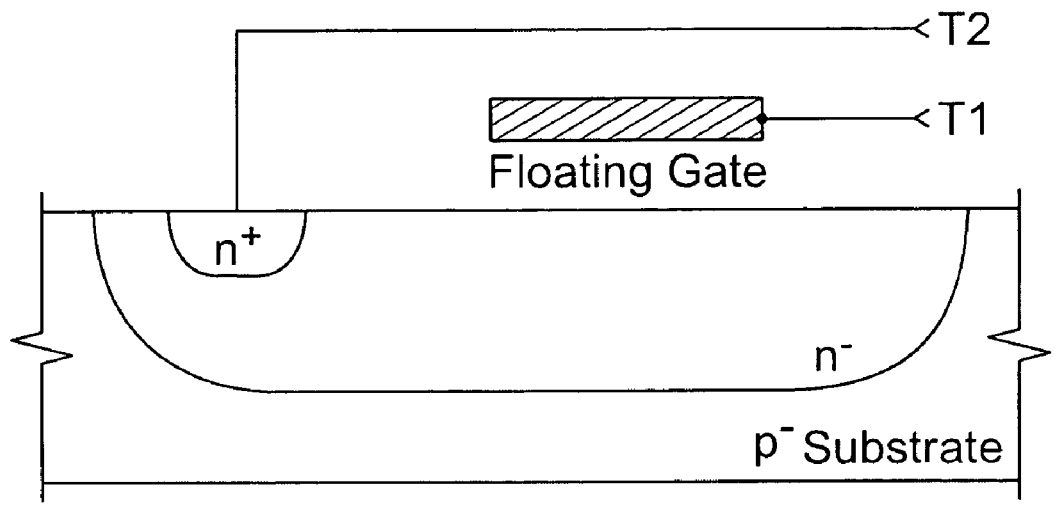
FIG. 1C is a side elevational diagram of a simplified capacitor structure as used in some embodiments of the present invention for the control capacitor structure.

In order to establish a large electric field across one of the pFETs' oxides, the gate area of one of the two corresponding shorted pFETs (e.g., M1c and M1t shown on he left side in FIG. 1A) should be made sufficiently large so that it acts as a control capacitor for the floating gate itself. FIG. 1B is a side elevational diagram of a well-source-drain shorted pFET as used in some embodiments of the present invention for the control capacitor structure and the tunneling transistor structure. Terminals T1 and T2 are the capacitor terminals. FIG. 1C is a side elevational diagram of a simplified capacitor structure as used in some embodiments of the present invention for the control capacitor structure. Terminals T1 and T2 are the capacitor terminals although the device of FIG. 1C is not, strictly speaking, a transistor. Those of ordinary skill in the art will now realize that various other structures may be used to achieve the same purposes.

Figure 2:
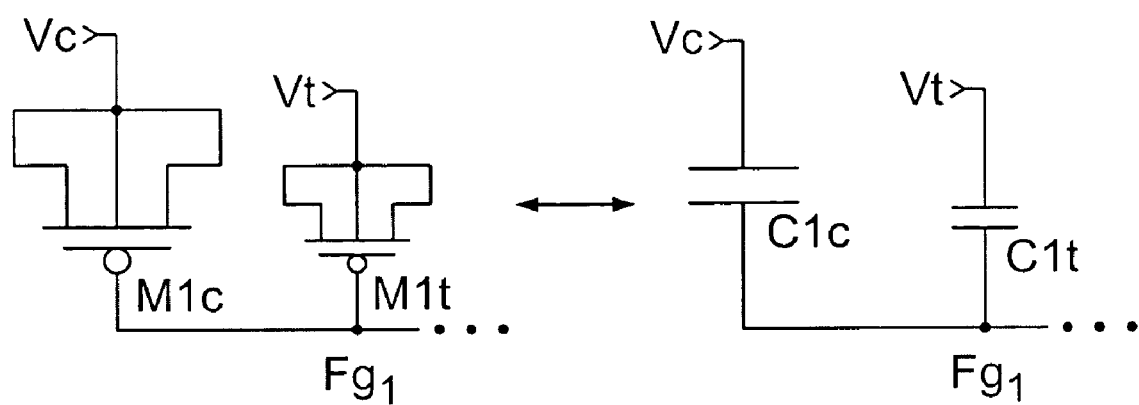
FIG. 2 is a partial electrical schematic diagram illustrating on the left a portion of the schematic of FIG. 1A with the control transistor (also referred to herein as a control capacitor or control capacitor structure) M1$c$ shown enlarged relative to tunneling transistor (also referred to herein as a tunneling transistor or tunneling transistor structure) M1$t$, and on the right the schematic diagram symbol for a capacitor C1$c$ takes the place of transistor M1$c$ and the schematic diagram symbol for a capacitor C1$t$ takes the place of transistor M1$t$.

Turning now to FIG. 2, on the left is a portion of the schematic of FIG. 1A with the transistor M1c shown enlarged relative to transistor M1t; on the right capacitor C1c takes the place of transistor M1c and capacitor C1t takes the place of transistor M1t. Where the physical size of transistor M1c is much larger than that of transistor M1t then M1c behaves like a control capacitor for the floating gate Fg1 and can be used to control the floating-gate voltage to establish a large electric field that can be used to induce bidirectional FN tunneling.

Figure 3:
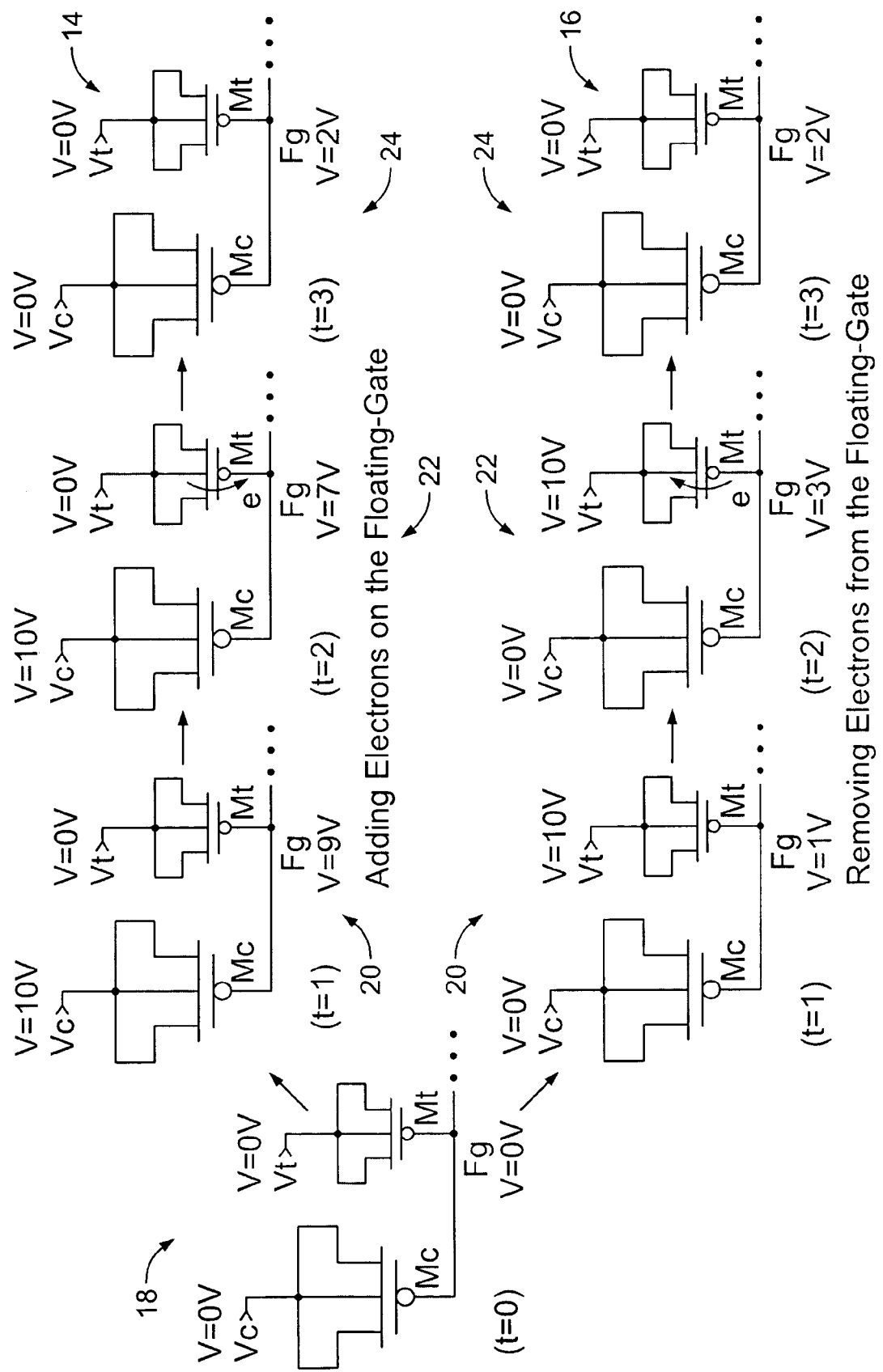
FIG. 3 is a process flow diagram formed of partial electrical schematic diagrams like those in FIG. 2 which illustrates the process for adding and removing electrons from a floating gate Fg in accordance with an embodiment of the present invention.

Turning now to FIG. 3, the process for adding and removing electrons from a floating gate Fg is illustrated. The upper branch of the process is denoted 14 and illustrates adding electrons to the floating gate to drop its voltage from 0V to −2V. The lower branch of the process is denoted 16 and illustrates removing electrons from the floating gate to raise its voltage from 0V to +2V.

In more detail, starting from the rest condition 18 with Vc=0V (Vc here is the voltage applied to the source, drain and well terminals of control transistor Mc), Vt=0V (likewise, Vt here is the voltage applied to the source, drain and well terminals of tunneling transistor Mt) and Fg=0V at time t=0, one first establishes the appropriate voltage across the oxide of one of the pFETs by changing the voltage of either Vc or Vt. Due to the skewed capacitive ratio between the two pFETs Mc and Mt, the floating gate is more strongly coupled to the control voltage Vc, creating a large electric field through the oxide of the tunneling pFET Mt at time t=1 (20). Once the electric field is present, electrons start tunneling through the oxide of Mt either adding or removing charge from the floating gate at time t=2 (22). After a certain amount of time the voltage of the floating gate has changed enough to decrease the electric field to the point that the tunneling process is slowed considerably. If the rest biases (Vc=Vt=0V) are then reapplied at time t=3 (24), the net effect of the procedure is that the charge on the floating gate was modified. The voltage values in the example of FIG. 3 are intended to be just an example. The real values will depend upon various factors such as oxide thickness and quality, desired program time, endurance and retention requirements, and the fabrication process used and are well within the skills of those of ordinary skill in the art having the benefit of this disclosure.

Figure 4:
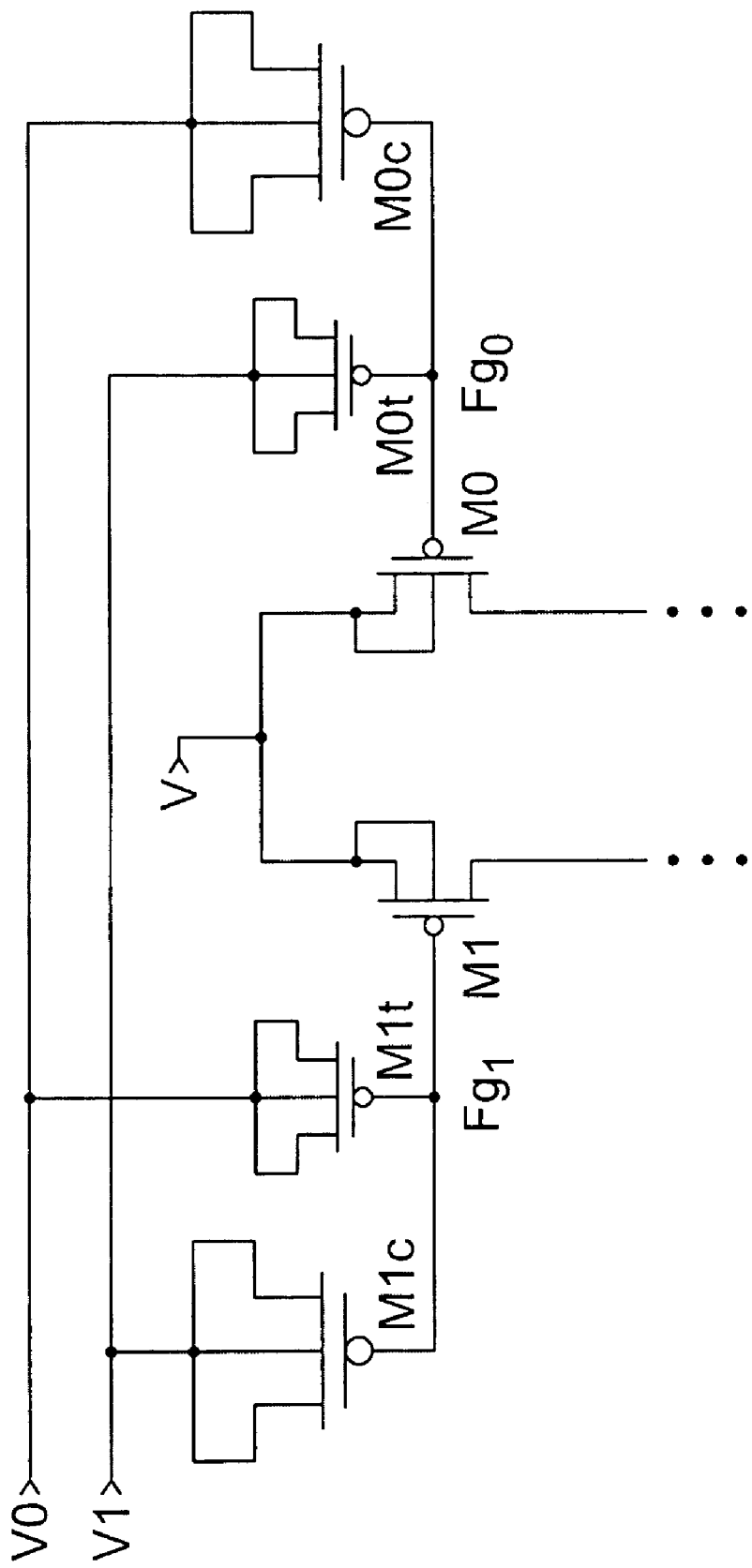
FIG. 4 is an electrical schematic diagram of an NVM cell in accordance with an embodiment of the present invention in which the V0 signal is coupled to the tunneling transistor M1$t$ for floating gate Fg$_1$ and to the control transistor M0$c$ for floating gate Fg$_0$ while the V1 signal is coupled to the control transistor M1$c$ for floating gate Fg$_1$ and to the tunneling transistor M0$t$ for floating gate Fg$_0$.

It is now easy to observe that if the opposite biasing voltages are applied to the "0" and "1" sides of the differential NVM cell, electrons can be removed from one floating gate while they are being added to the other. This can be easily accomplished by connecting the NVM cell as illustrated in FIG. 4. In this embodiment, the V0 signal is coupled to the tunneling transistor M1t for floating gate $Fg_1$ and to the control transistor M0c for floating gate $Fg_0$ while the V1 signal is coupled to the control transistor M1c for floating gate $Fg_1$ and to the tunneling transistor M0t for floating gate $Fg_0$.

Figure 5:
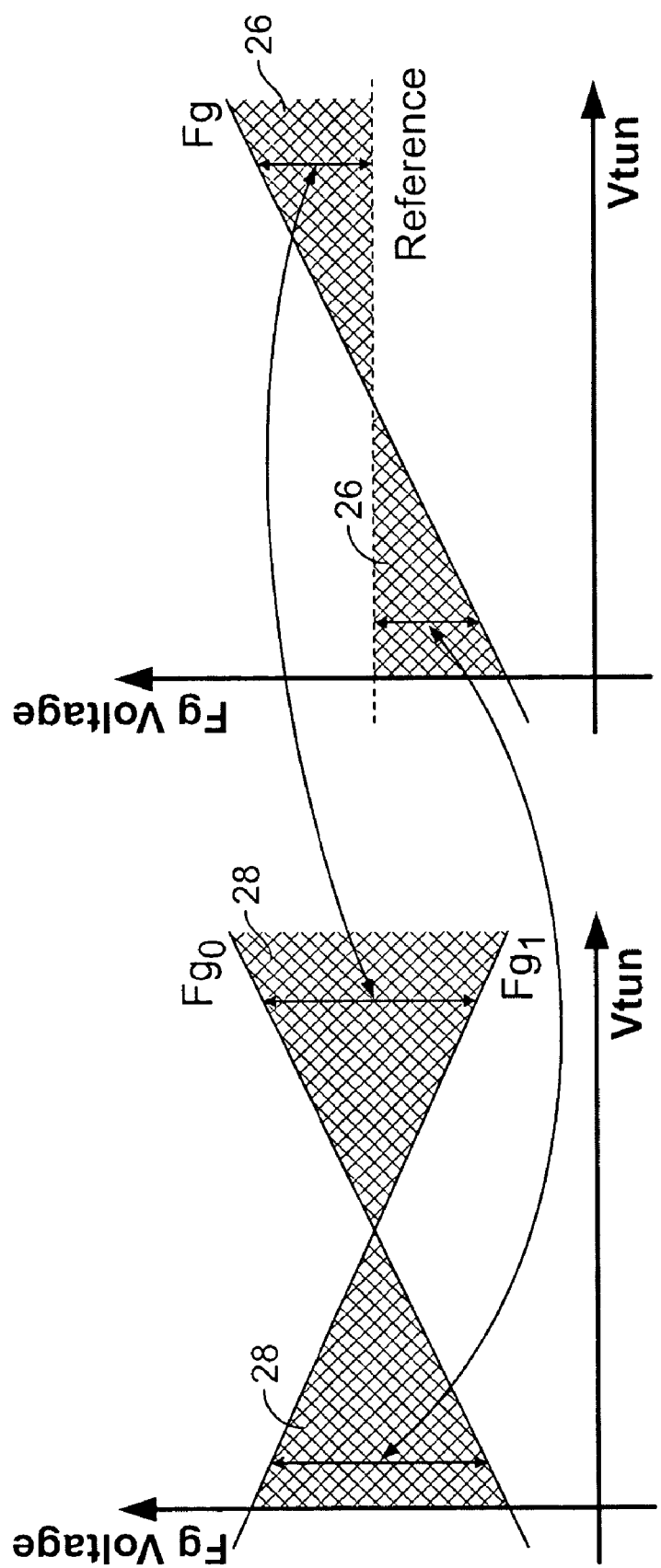
FIG. 5 is a plot of Vtun (tunneling voltage) vs. floating gate voltage for the differential and single-ended cases of NVM cells.

The use of a differential memory cell is advantageous because it allows the doubling of the storage window with respect to a single-ended memory cell. This is illustrated in FIG. 5 which shows a plot of Vtun (tunneling voltage) vs. floating gate voltage for the differential and single-ended cases. In a single-ended cell, a reference voltage is generally required and a viable result may be obtained in the sectors shown as shaded and denoted 26. In the double-ended cell, no reference voltage is required and a viable result may be obtained in the much larger sectors shown as shaded and denoted 28.

A single-ended approach, on the other hand, has the benefit of reducing by approximately half the number of transistors in the memory cell thus providing an advantage with respect to the differential version in terms of area and cost. The memory cell of FIG. 1A, and the other versions thereof shown and described herein, can be easily implemented as single-ended cells in accordance with the teachings herein with particular reference to FIGS. 6A, 6B and 6C. Differential memory is particularly advantageous in situations where reliable reference voltage sources are not readily available, such as in portable devices, remotely powered devices (such as RFiD tags and security cards), and the like.

Figure 6A:
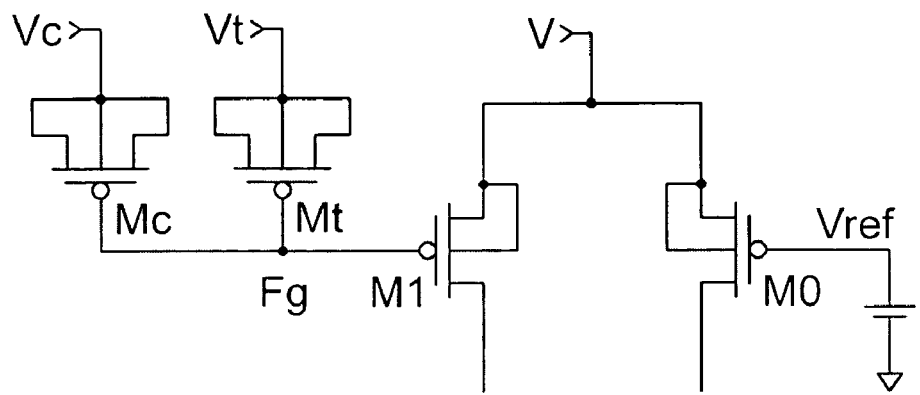
FIGS. 6A, 6B and 6C illustrate various ways to implement the present invention in a single-ended circuit. In accordance with the circuit of FIG. 6A the second floating gate is coupled to a voltage source to provide a voltage reference for the pFET M0. A practical reference can be ground itself as illustrated in FIG. 6B. The pFET M0 can be omitted altogether as in FIG. 6C if a current reference (not shown) is available to the sense amplifier for the current comparison.
Figure 6B:
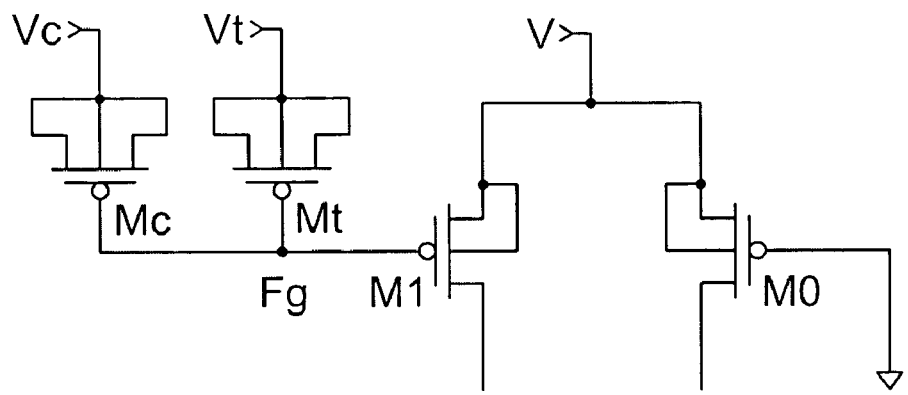
Figure 6C:
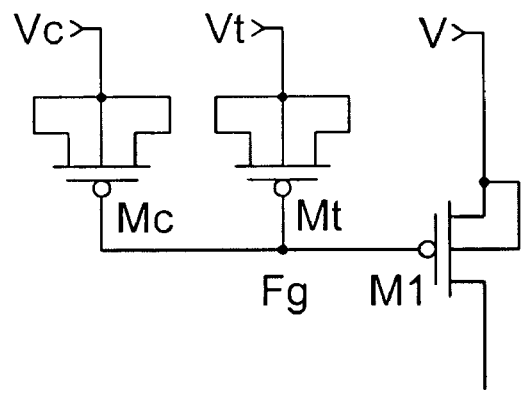

FIGS. 6A, 6B and 6C illustrate various ways to implement the present invention in a single-ended circuit. In accordance with the circuit of FIG. 6A the second floating gate is coupled to a voltage source to provide a voltage reference for the pFET M0. A practical reference can be ground itself as illustrated in FIG. 6B. The pFET M0 can be omitted altogether as in FIG. 6C if a current reference (not shown) is available to the sense amplifier for the current comparison.

In accordance with the embodiments of FIGS. 6A, 6B and 6C, to program a logic "0" in a cell that has a stored logic "1" it is necessary to apply the correct voltages to the terminals V0 and V1 (See, e.g., FIG. 4). Using the convention that there is a logic "0" when I0>I1 the correct voltages are V0=10V and V1=0V (note that, if desired, the convention could be reversed).

For technical reasons (to avoid overstressing the oxide with excess tunneling current) and practical reasons (limitation of the charge pump supplying the high-voltage) the high-voltage applied to program the cell is not held constant but rather is applied with a ramp-like profile. It is possible to perform a timed program operation where the high-voltage is applied for a certain amount of time that is deemed sufficient to tunnel the right amount of charge to and from the floating gates. This can be problematic where transistors are not precisely identical throughout an array or chip as size or conductivity differences may lead one cell to require a longer amount of time to achieve the same state as another cell. Another approach involves applying the high-voltage until a read operation on the memory cell reports that the desired logic value is stored in the cell. This does not pose any technical problems because the time it takes to read the cells is much less than the time it takes to write them. To insure a sufficient write margin a hysteresis mechanism can be introduced to make sure the desired programming window is achieved. Hysteresis can be achieved either by subtracting some current from the winning side (the side that is increasing its intrinsic current, also known as the high current side) or by adding some current to the losing side (the side that is decreasing its intrinsic current, also known as the low current side). This concept is illustrated in FIGS. 7A, 7B and 7C.

Figure 7A:
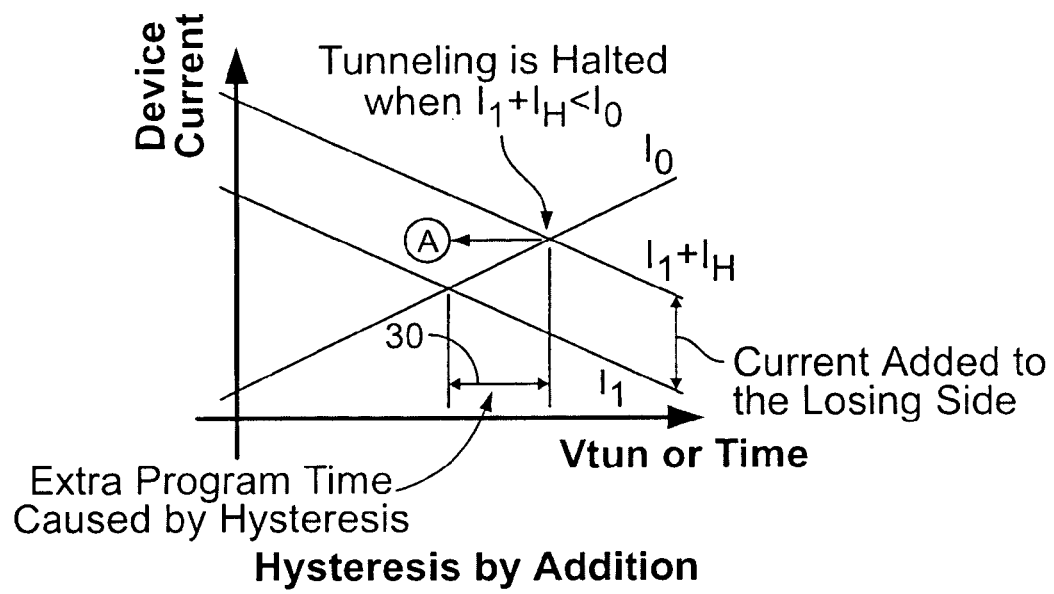
FIG. 7A is a plot of Device readout current vs. Vtun (or, effectively, time) and illustrating the concept of hysteresis by addition in accordance with an embodiment of the present invention. The $I_0/I_1$ curves are the nominal curves. The $I_1+I_H$ curve represents the $I_1$ curve to which has been added hysteresis current $I_H$. Tunneling is thus halted when $I_1+I_H<I_0$.
Figure 7B:
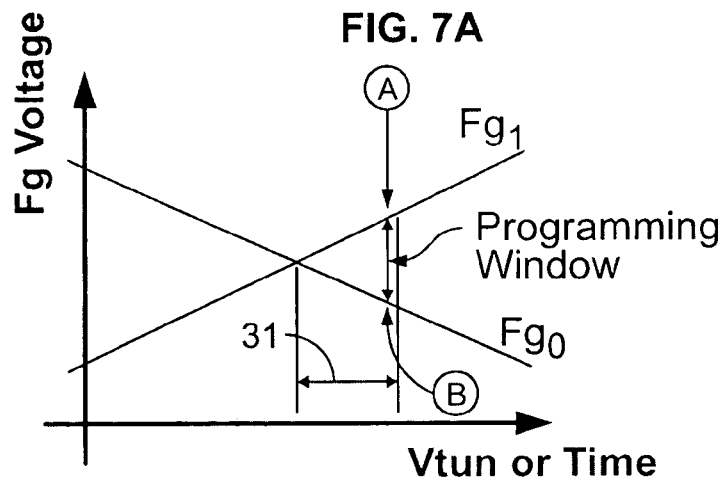
FIG. 7B is a plot of Fg Voltage vs Vtun (or time) for $Fg_0$ and $Fg_1$ illustrating the increase in the size of the programming window as a result of adding the hysteresis current $I_H$.
Figure 7C:
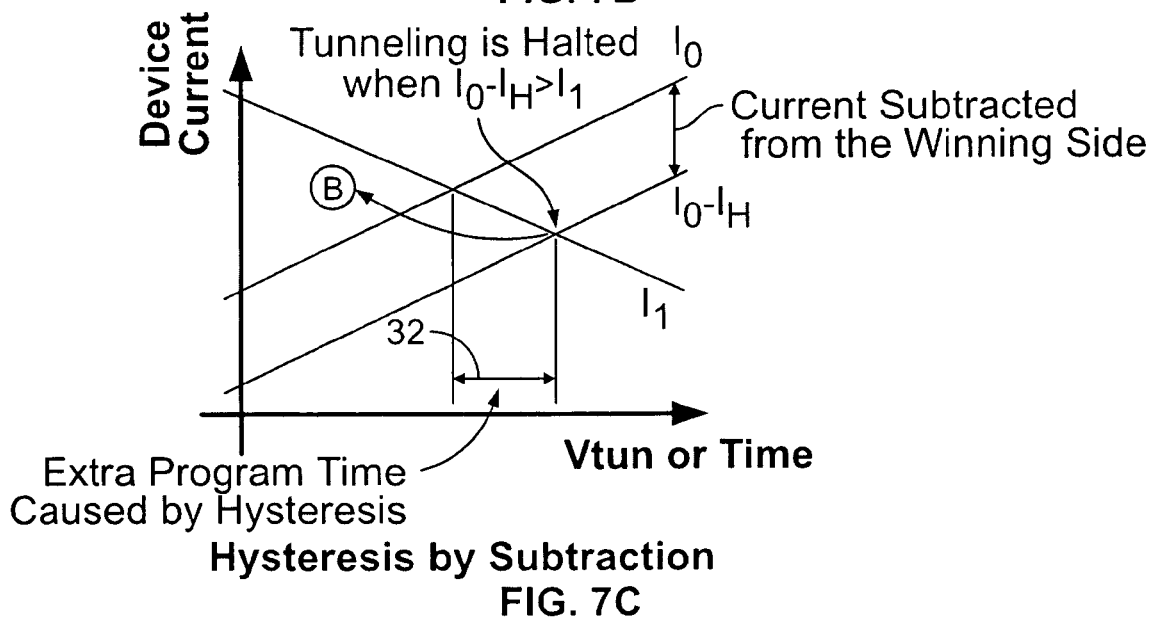
FIG. 7C is a plot of Device current vs. Vtun (or time) and illustrating the concept of hysteresis by subtraction in accordance with an embodiment of the present invention.
Figure 7D:
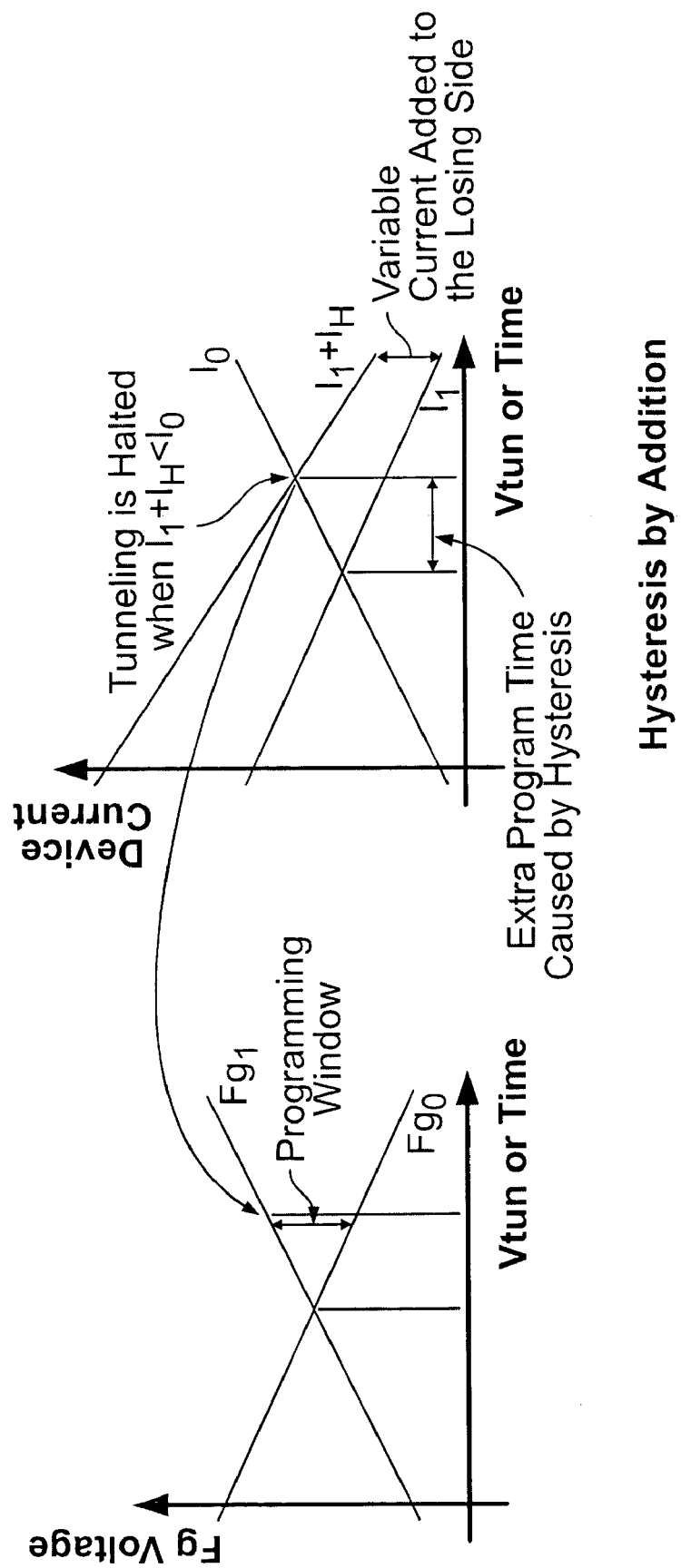
FIG. 7D is a plot similar to that of FIG. 7A, except that the hysteresis current depends on the floating gate value, and the hysteresis current $I_H$ is not fixed.

FIG. 7A is a plot of Device readout current vs. Vtun (or, effectively, time) and illustrating the concept of hysteresis by addition. The $I_0/I_1$ curves are the nominal curves. The $I_1+I_H$ curve represents the $I_1$ curve to which has been added hysteresis current $I_H$. Tunneling is thus halted when $I_1+I_H<I_0$. FIG. 7B is a plot of Fg Voltage vs Vtun (or time) for $Fg_0$ and $Fg_1$ illustrating the increase in the size of the programming window as a result of adding the hysteresis current $I_H$. FIG. 7C is a plot of Device current vs. Vtun (or time) and illustrating the concept of hysteresis by subtraction. The $I_0/I_1$ curves are the nominal curves. The $I_0-I_H$ curve represents the $I_0$ curve from which has been subtracted hysteresis current $I_H$. Tunneling is thus halted when $I_0-I_H>I_1$. Extra program time to achieve the additional margin is incurred by the hysteresis—shown as 30 in FIG. 7A, 31 in FIGS. 7B and 32 in FIG. 7C. FIG. 7D is a plot similar to that of FIG. 7A, except that the hysteresis current depends on the floating gate value, and the hysteresis current $I_H$ is not fixed.

Figure 8:
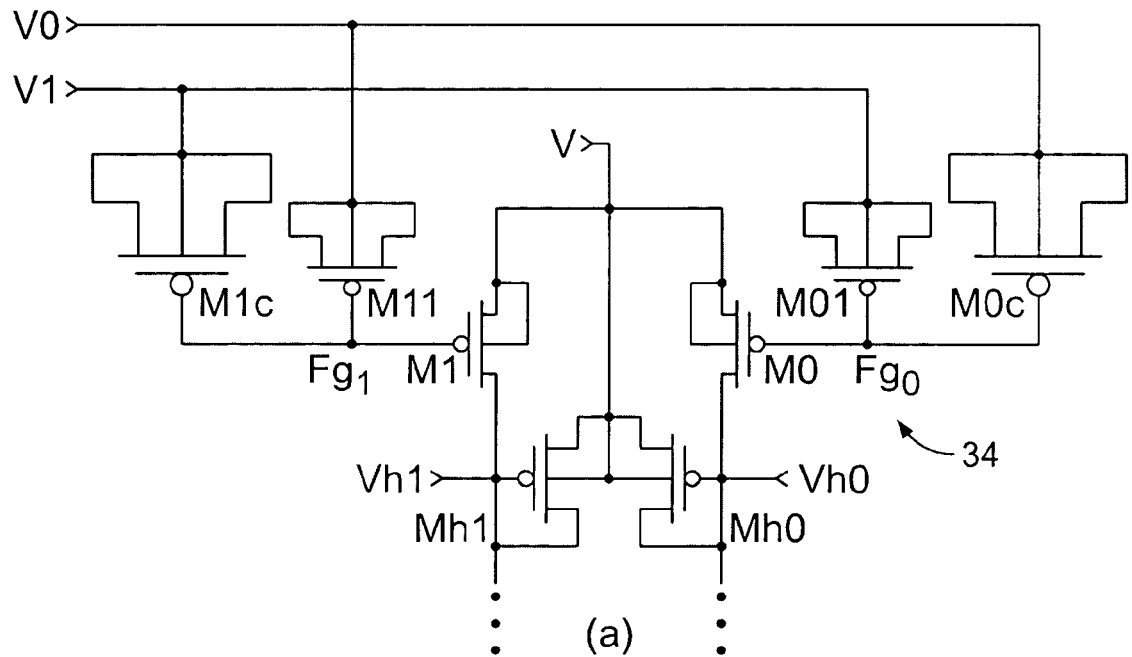
FIG. 8 is an electrical schematic diagram of an NVM cell 34 in accordance with an embodiment of the present invention. The NVM cell 34 utilizes hysteresis by addition and has added pFET transistors Mh1 and Mh0 which have their source and well terminals coupled to V and their drains coupled to the respective current output legs (drains) of the M1 and M0 readout transistors. In this way the current from Mh1 is added to transistor M1's output current and the current from Mh0 is added to transistor M0's output current. The control signals Vh1 and Vh0 applied, respectively, to the gates of Mh1 and Mh0 control the hysteresis during programming.
Figure 9:
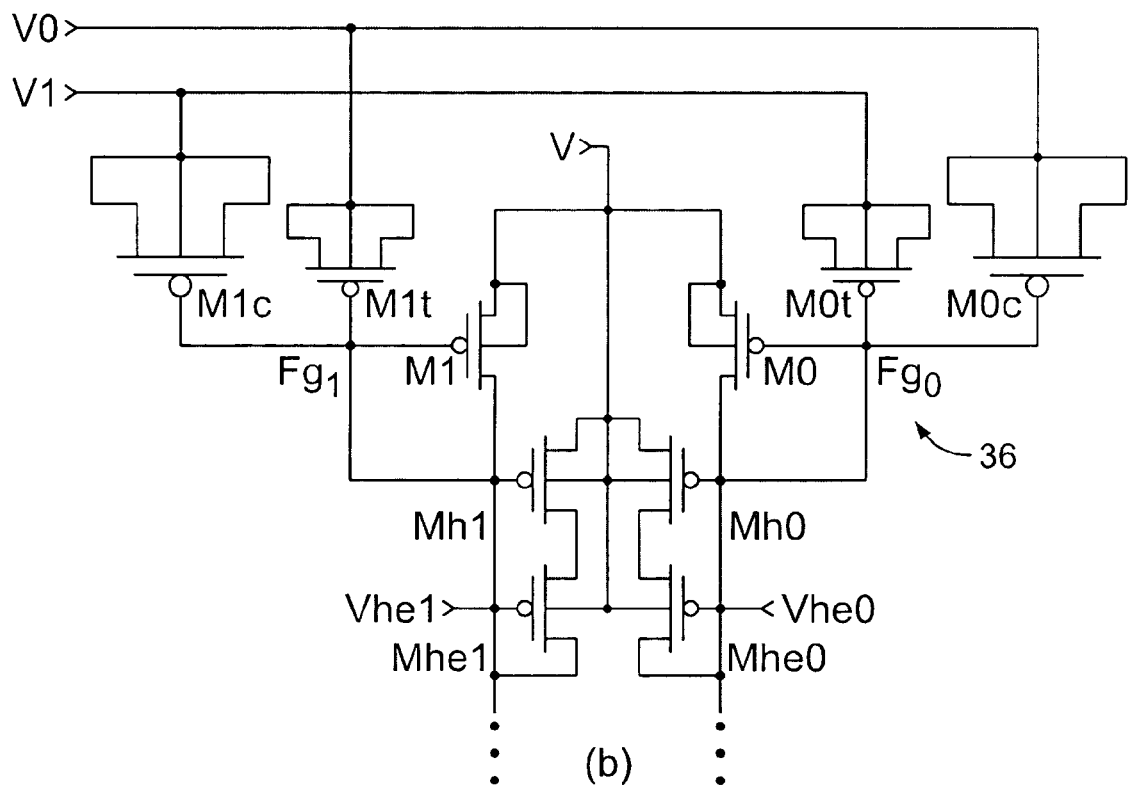
FIG. 9 is an electrical schematic diagram of an NVM cell 36 in accordance with an embodiment of the present invention. The NVM cell 36 utilizes hysteresis by addition and has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates.
Figure 10:
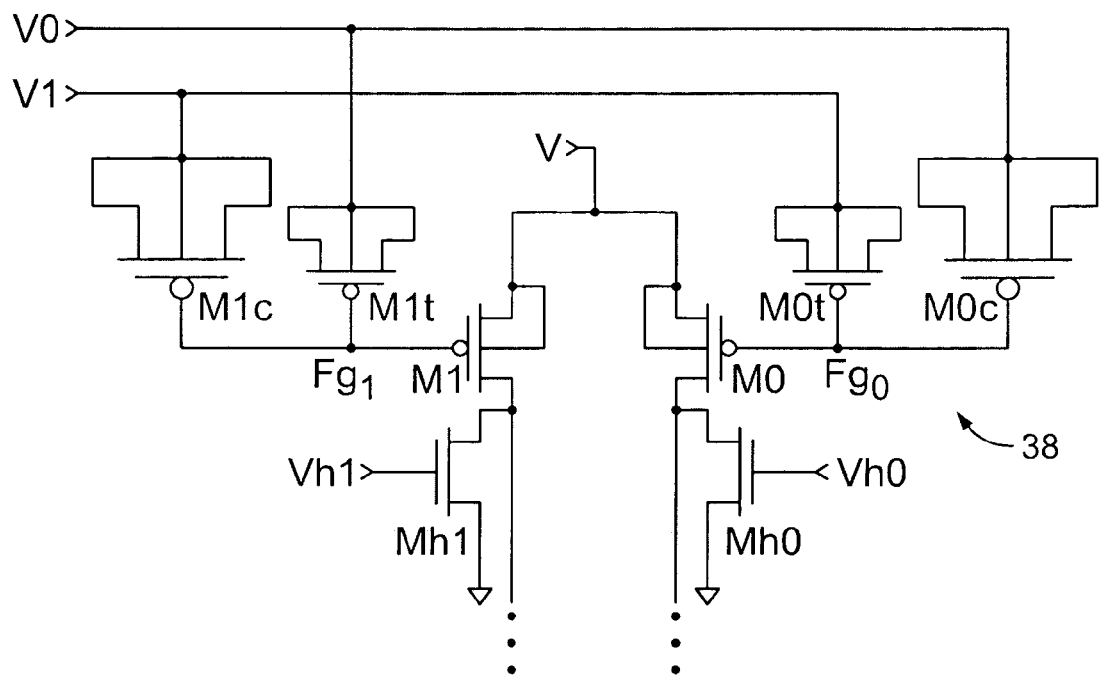
FIG. 10 is an electrical schematic diagram of an NVM cell 38 in accordance with an embodiment of the present invention. The NVM cell 38 utilizes hysteresis by subtraction and has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

In order to implement the hysteresis during programming the basic NVM cell may be modified to include transistors necessary to perform the function. Some examples of such modifications of the basic memory cell are depicted in FIGS. 8, 9 and 10. The FIG. 8 (hysteresis by addition) NVM cell 34 has added pFET transistors Mh1 and Mh0 which have their source and well terminals coupled to V and their drains coupled to the respective current output legs (drains) of the M1 and M0 readout transistors. In this way the current from Mh1 is added to transistor M1's output current and the current from Mh0 is added to transistor M0's output current. The control signals Vh1 and Vh0 applied, respectively, to the gates of Mh1 and Mh0 control the hysteresis during programming.

The FIG. 9 (hysteresis by addition) NVM cell 36 has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates. Transistors Mh1 and Mh0 in this application have their gates coupled, respectively, to floating gates $Fg_1$ and $Fg_0$ which has the effect of making the hysteresis current proportional to the current of the readout transistor. This approach allows the combined current of the hysteresis transistor and the readout transistor to go to zero and thus guarantees that cell programming can complete. With a fixed hysteresis current, cell programming may not complete if the hysteresis current exceeds the maximum available current from the readout transistor. This is reflected by FIG. 7D.

The FIG. 10 (hysteresis by subtraction) NVM cell 38 has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

Figure 11A:
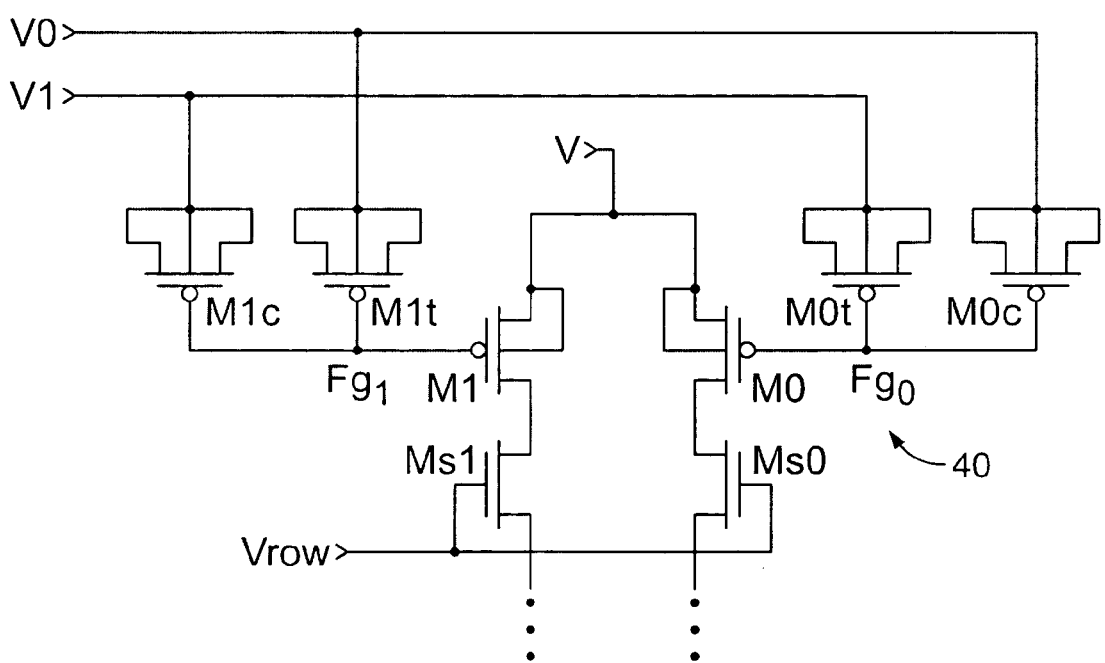
FIG. 11A is an electrical schematic diagram of an NVM cell 40 in accordance with an embodiment of the present invention. The NVM cell 40 includes a pair of nFET readout transistors Ms1 and Ms0 configured as row-select transistors, which control current flow in the drain legs of readout transistors M1 and M0, respectively.
Figure 11B:
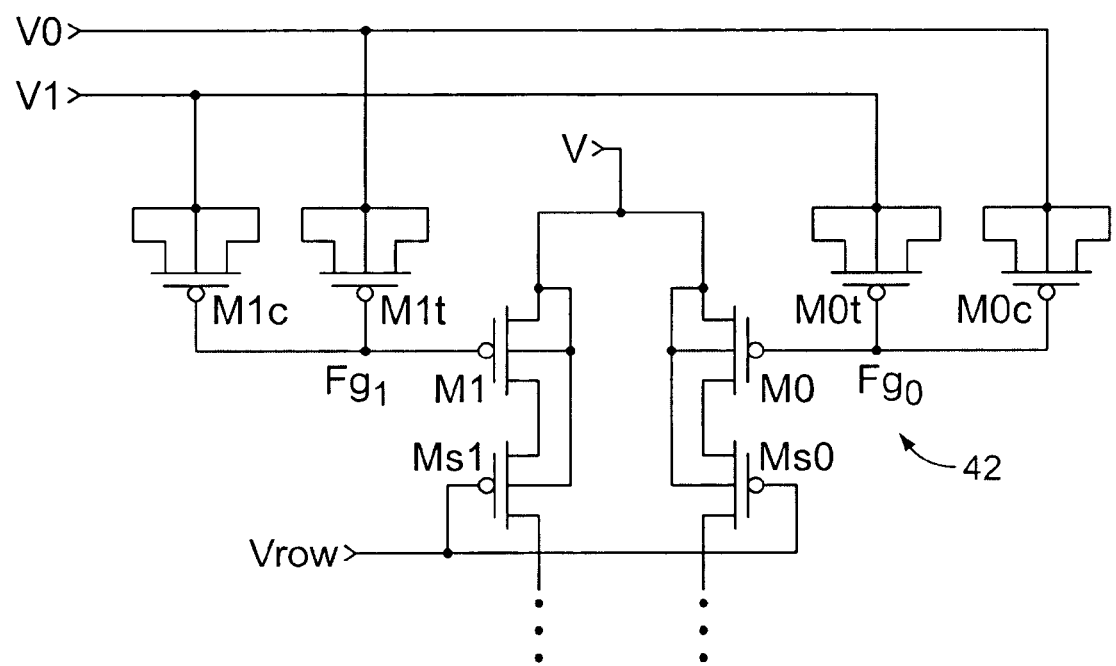
FIG. 11B is an electrical schematic diagram of an NVM cell 42 in accordance with an embodiment of the present invention. The NVM cell 42 includes a pair of pFET readout transistors Ms1 and Ms0 configured as row-select transistors, which control current flow in the drain legs of readout transistors M1 and M0, respectively.

In order to provide an array-type memory disposed in columns and rows as is common in semiconductor memories, it may be desirable to provide readout transistors to control which cells are being read out at a given moment. In NMV circuit 40 of FIG. 11A a pair of nFET readout transistors Ms1 and Ms0 configured as row-select transistors control current flow in the drain legs of readout transistors M1 and M0, respectively. The Vrow signal is coupled to the gates of Ms1 and Ms0 to control whether they conduct or not. Similarly, in NVM circuit 42 of FIG. 11B a pair of pFET readout transistors Ms1 and Ms0 control current flow in the drain legs of readout transistors M1 and M0, respectively. The Vrow signal is coupled to the gates of Ms1 and Ms0 to control whether they conduct or not. These may be used with, or without, the hysteresis transistors discussed above, as desired. Hysteresis current may be added before or after the row select transistors. Hysteresis current added after the row select transistors may be common to all the memory cells in the column. This reduces the total number of devices required and thus reduces memory area.

Figure 12:
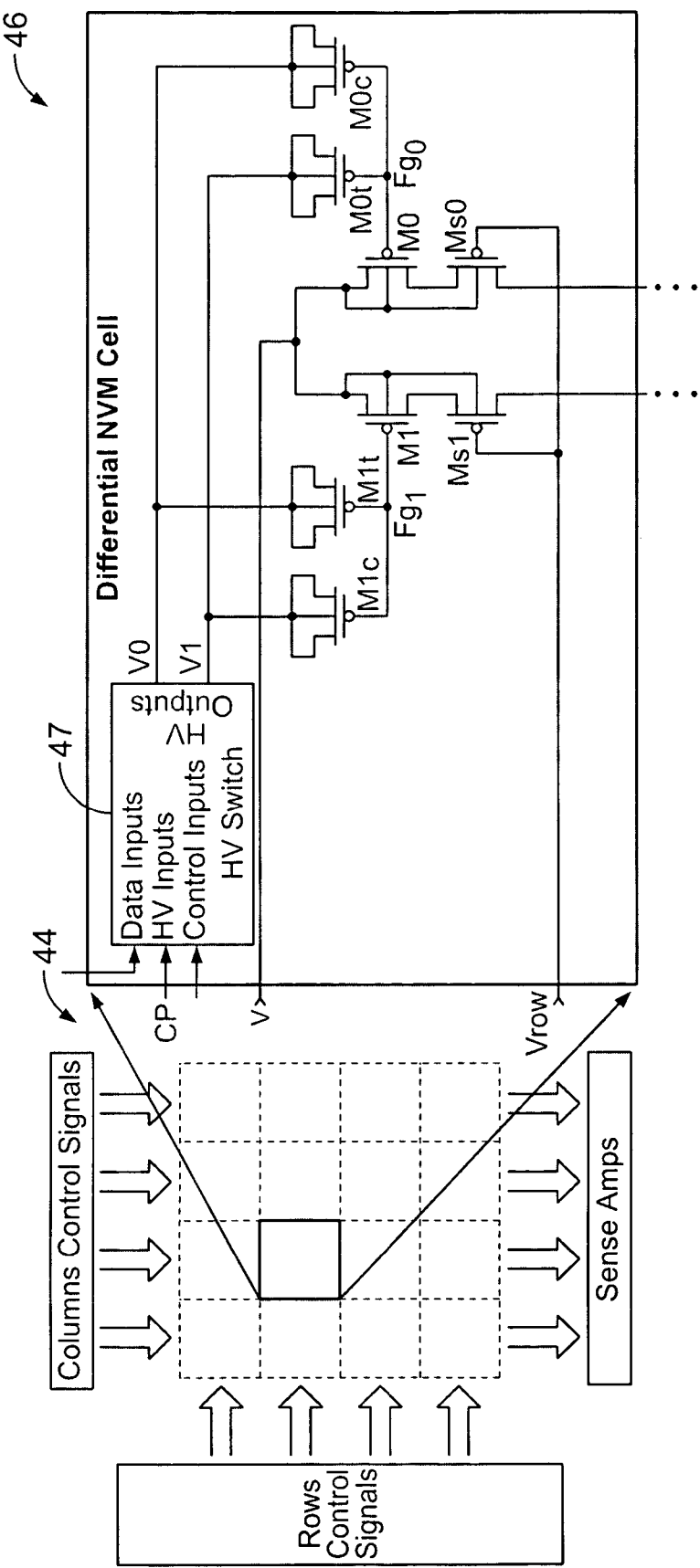
FIG. 12 is a block diagram of an array of NVM cells and an electrical schematic diagram of one of those cells in accordance with an embodiment of the present invention.

Once the row-select transistors are embedded in the nonvolatile memory cells it is possible to array the cells in a row-column configuration like the one depicted in FIG. 12. A drawback of this approach is that every nonvolatile memory cell will be required to contain a high-voltage switch (typically a high-voltage nFET with its drain disposed in an n+ region such as an LDMOS (lateral defused MOS) or a DEMOS (drain extended MOS) cascoded with another nFET so that it can handle the relatively high voltages used for writing the NVM cells without breaking down) to provide the appropriate data-dependent voltages to the V0 and V1 terminals of the memory cell during programming.

In the array 44 of NVM cells 46 depicted in FIG. 12, column control signals comprise the data inputs referred to as D1 and D0 for the cell; row control signals comprise the row select signals and any hysteresis control signals which may be used as well as the high-voltage power for the high-voltage switch for each NVM cell. Other control signals may be also used, depending on the particular implementation, such as the choice of switch, etc. V may be applied via the row control signals to each NVM cell or it may be provided in some other way such as with the column control signals. Sense amplifiers are arranged for each column to receive the drain current from M1 and M0 for the selected row.

Figures 13, 14:
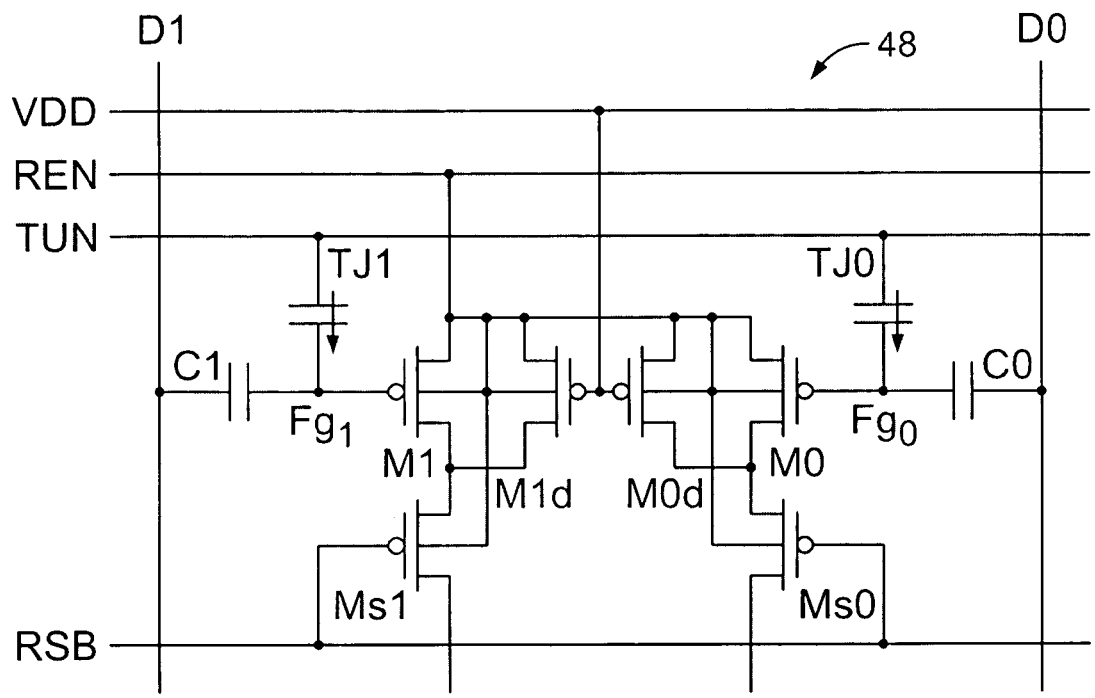
FIG. 13 is an electrical schematic diagram of an NVM cell for use in an array of NVM cells in accordance with an embodiment of the present invention.
FIG. 14 is a table illustrating a set of applied voltages and operating states for the NVM cell of FIG. 13.

In this embodiment a high-voltage switch has to be included in every cell location in order to prevent program-disturb—changing an already-programmed cell contents while writing a different cell. In order to overcome this drawback and make a more space-efficient NVM cell, the basic NVM cell may be reconfigured to that shown in FIG. 13. The FIG. 13 drawing shows the tunneling transistors as capacitors denoted TJ1 and TJ0 and the control transistors as capacitors denoted C1 and C0 for clarity but they may be implemented with the pFETs as illustrated, for example, in FIGS. 1 and 2, discussed above. In this embodiment, VDD is provided at all times to bias the gates of transistors M1d and M0d; REN (row enable); TUN and RSB (row select bar) are provided as shown in the table of FIG. 14. The signals VDD, REN, TUN and RSB are the row control signals, although VDD need not be applied via a row and could instead be applied via a column. The column control signals comprise the data signals on lines D1 and D0 and these are applied as illustrated, for example, in the table of FIG. 14. Other values may also be possible.

The NVM cell circuit 48 of FIG. 13 differs from the NVM cell circuit 46 of FIG. 12 in that in addition to the removal of the high-voltage switch 47 from the NVM cell 46 (because the high-voltage switching can be handled once per line per row or column), two additional pFETs M1d and M0d have been added. M1d and M0d have their gates coupled together and to VDD and their sources, drains and well connections coupled to the corresponding sources, drains and well connections of respective readout transistors M1 and M0. This is done in order to avoid disturbing the contents of the cell when it is not selected. As can be see from the table in FIG. 14, during read operations, the REN (row enable) line is set to VDD and with the gates of M1d and M0d at VDD M1d and M0d are not conducting and readout transistors M1 and M0 operate normally to provide an output current as a function of charge stored on corresponding floating gates $Fg_1$ and $Fg_0$. During a write operation for a different cell in the same column, REN is set to approximately half the tunneling voltage. With VDD on the gates of M1d and M0d, M1d and M0d conduct, effectively connecting the drain nodes of M1 and M0 to REN. Since the drain, source and bulk nodes of both M1 and M0 are set to half the tunneling voltage, there can be no tunneling across M1 or M0. And since TUN is also set to half the tunneling voltage during this write protect mode, there can be no tunneling across TJ1 or TJ0.

Figure 15:
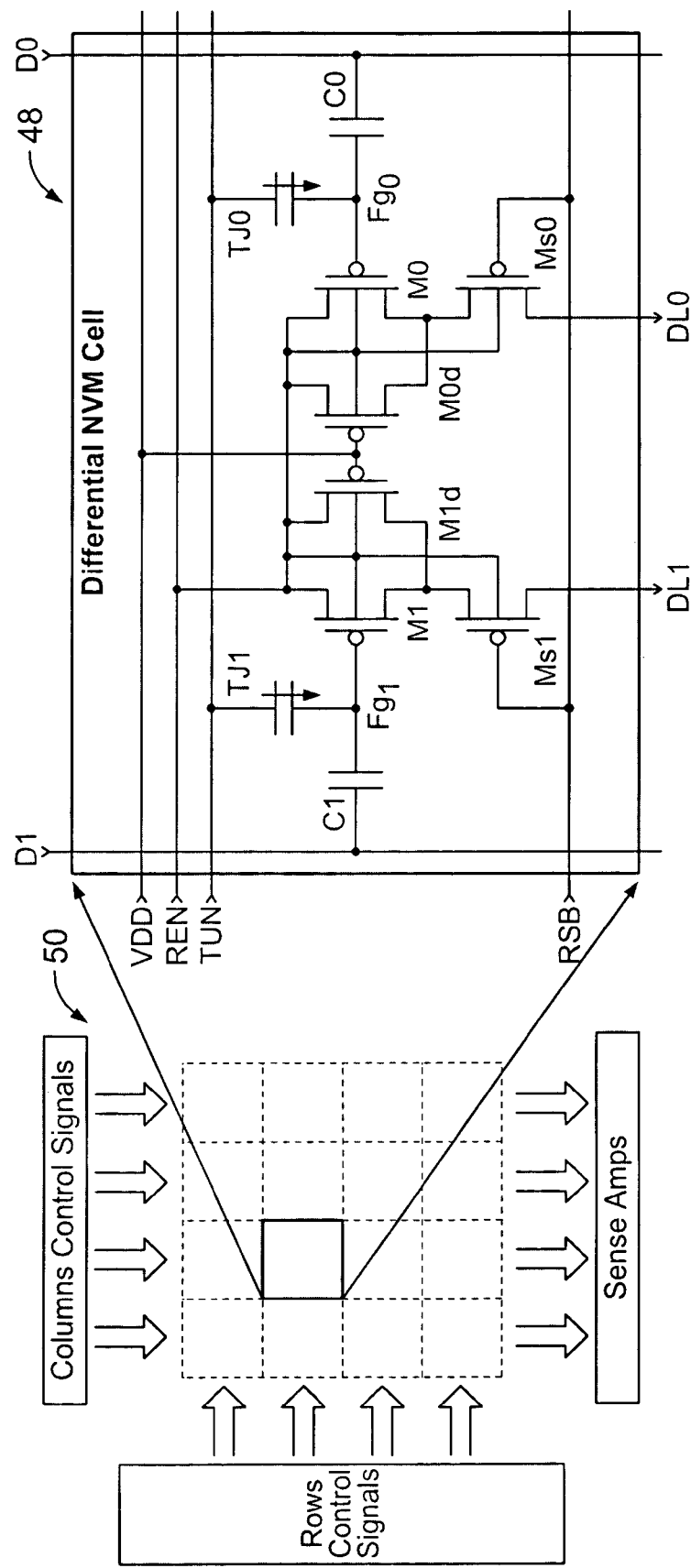
FIG. 15 is a block diagram of an array of NVM cells in accordance with FIG. 13 and an electrical schematic diagram of one of those cells in accordance with an embodiment of the present invention.

Turning now to FIG. 15, an array 50 of NVM cells 48 is depicted which operates in accordance with the voltages stated in the table of FIG. 14. Smaller minimum feature sizes and reduced oxide thickness may reduce these voltage requirements somewhat. In this array 50 the TUN, REN and RSB signals are common for a given row and comprise the row control signals while D1 and D0 are common for a given column and comprise the column control signals. Sense amplifiers (or equivalent readout circuitry) is provided for each column and reads the output currents for the selected row.

Figure 16:
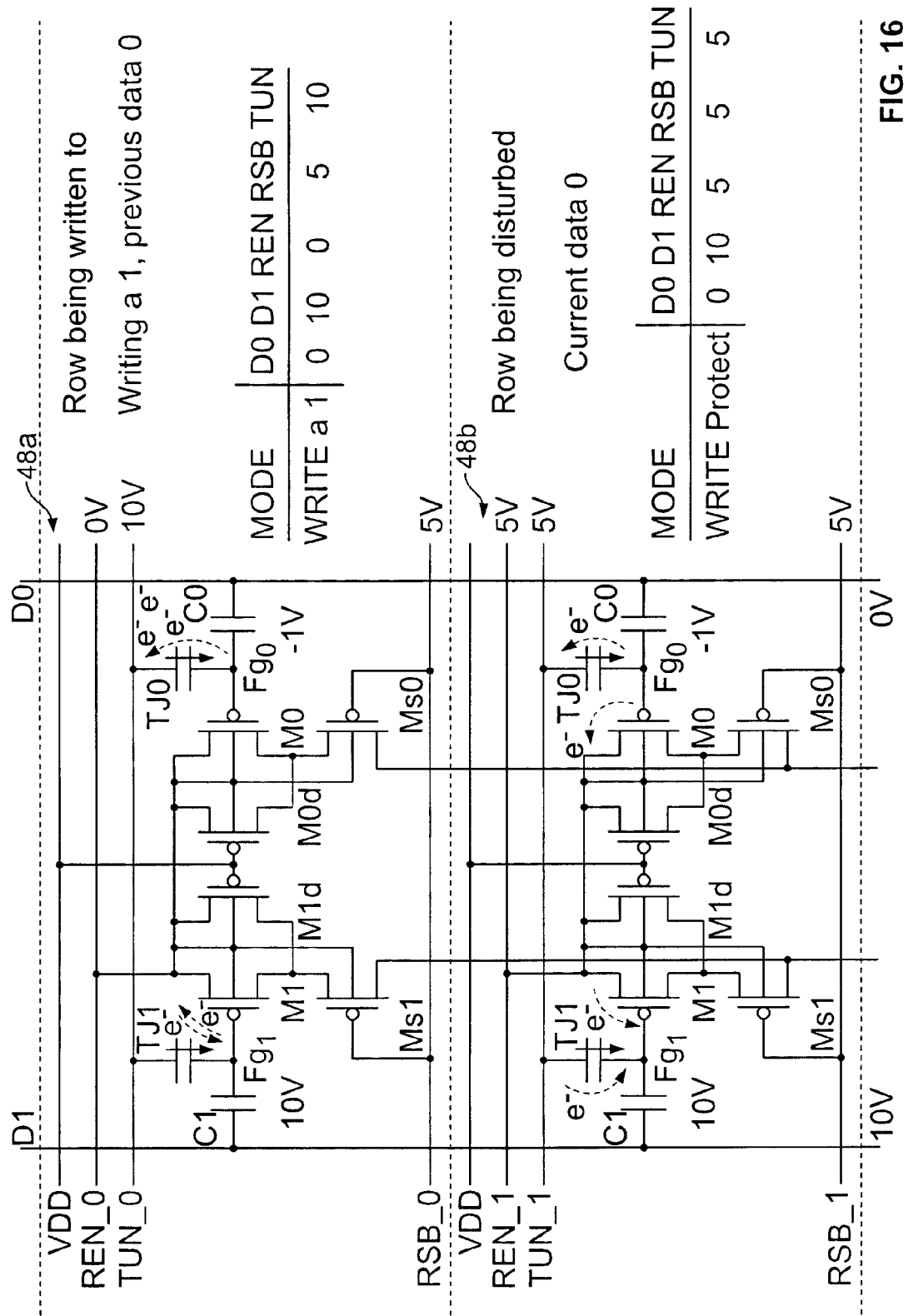
FIG. 16 is an electrical schematic diagram illustrating how the present invention avoids program disturb with respect to two adjacent NVM cells within the same column.

FIG. 16 illustrates how the present invention avoids program disturb with respect to two adjacent NVM cells 48a and 48b within the same column. Cell 48a is having a 1 written where the previously stored data was a zero (as after the cell was erased, for example). In this case, using the figures from the table in FIG. 14, D0=0V, D1=10V, REN__0 (for this row)=0V, RSB__0 (for this row)=5V and TUN__0 (for this row)=10V. In the adjacent cell 48b, to avoid disturbing already-stored data, D0=0V and D1=10V because these are in common with NVM cell 48a. REN__1=RSB__1=TUN__1=5V. This prevents disturb and also keeps any current from M1 and M0 of NVM cell 48b from contributing to the output current.

Figures 17, 18:
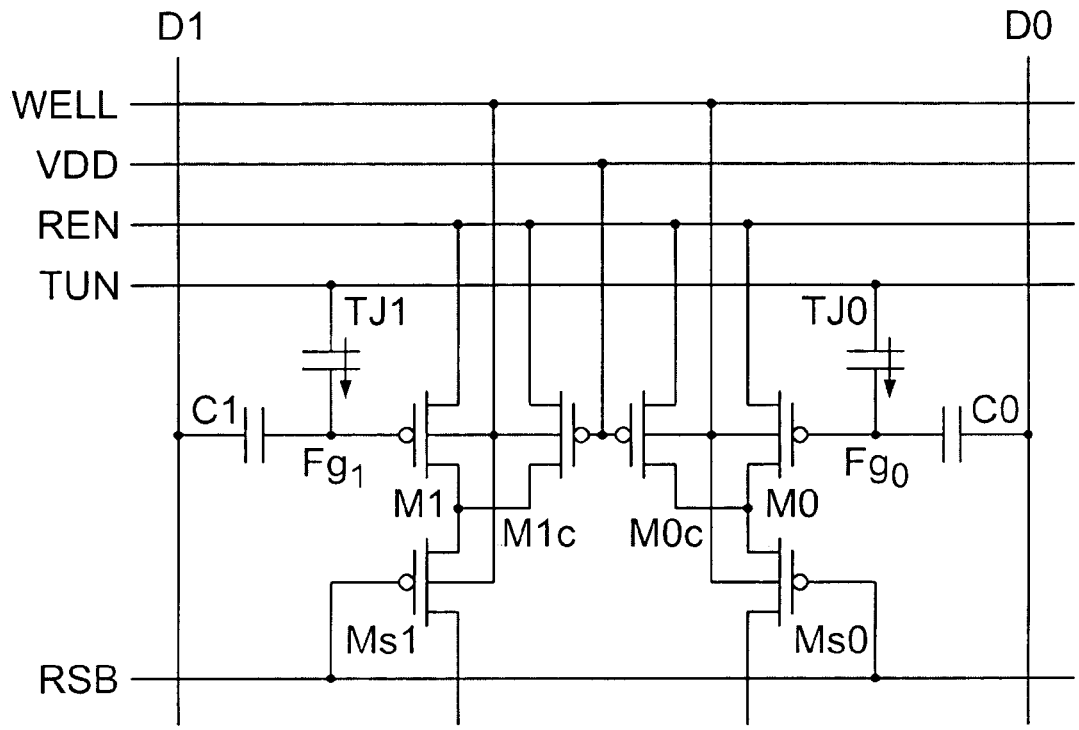
FIG. 17 is an electrical schematic diagram of an NVM cell for use in an array of NVM cells in accordance with another embodiment of the present invention.
FIG. 18 is a table illustrating a set of applied voltages and operating states for the NVM cell of FIG. 17.

FIG. 17 is an electrical schematic diagram of an NVM cell for use in an array of NVM cells in accordance with another embodiment of the present invention. The difference between the cell of FIG. 17 and the cell of FIG. 13 is that the well of at least some of the FET devices is not controlled directly by signal REN, but from a different signal (WELL) in the FIG. 17 embodiment. This permits more freedom in the choice of biasing condition during various states of operation. In the embodiment of FIG. 17, the TUN, REN and RSB signals are common for a given row of an array of like memory cells; the D1 and D0 signals are common for a given column of like memory cells and the WELL signal can be shared by all like memory cells in the array.

FIG. 18 is a table illustrating a set of applied voltages and operating states for the NVM cell of FIG. 17. Those of ordinary skill in the art will now realize that other values may also work.

A method of operating the cells described herein includes applying the voltage signals set forth in exemplar FIGS. 14 and 18 to the corresponding cells of FIGS. 13 and 17, respectively. The voltages are typically developed on chip using charge pumps for minimum size. Charge pumps may provide static voltages, or, more effectively, ramped voltages as are well known to those of ordinary skill in the art. In accordance with the claims set forth below, the "biasing" may be achieved with the control capacitor structure. The "charging" and "discharging" may be achieved with the tunneling capacitor structure to achieve Fowler-Nordheim tunneling. Note that the voltages set forth in FIGS. 14 and 18 are exemplary voltages for use with devices built in a 0.18 micron minimum feature size logic CMOS fabrication process technology. As technology improves, minimum feature sizes steadily decrease until some possible fundamental physical limit is ultimately reached. As these sizes decrease, the voltages used will also decrease as the same electric field can be achieved with a smaller voltage over a correspondingly smaller distance. Thus, the voltages set forth in FIGS. 14 and 18 are examples only and those of ordinary skill in the art will now realize that other voltages may be used where appropriate for the process technology used to fabricate the memory cells.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A nonvolatile memory cell, comprising:
a first floating gate;
a first pFET having gate, source and drain terminals, said gate terminal coupled to said first floating gate;
a first control capacitor structure having a first terminal coupled to a first voltage supply node and a second terminal coupled to said first floating gate;
a first tunneling capacitor structure having a first terminal coupled to a second voltage supply node and a second terminal coupled to said first floating gate; and
a first readout switch coupled between said drain of said first pFET and a readout node, a control node of said readout switch coupled to a source of a readout enable signal.

2. The cell of claim 1, further comprising:
a Vdd voltage supply node having a direct electrical connection to said source terminal of said first pFET.

3. The nonvolatile memory cell of claim 2, wherein:
said first pFET further comprises a well terminal coupled to said Vdd voltage supply node.

4. The nonvolatile memory cell of claim 2, wherein:
a control capacitance disposed between said first terminal of said first control capacitor structure and said second terminal of said first control capacitor structure exceeds a remaining capacitance comprised of a tunneling capacitance between said first terminal of said first tunneling capacitor structure and said second terminal of said first tunneling capacitor structure and other capacitance between said first floating gate and other nodes of the nonvolatile memory cell.

5. The nonvolatile memory cell of claim 4, wherein:
said first pFET further comprises a well terminal coupled to said Vdd voltage supply node.

6. The nonvolatile memory cell of claim 4, wherein:
said first control capacitor structure comprises a pFET having gate, source and drain terminals, said gate terminal coupled to said first floating gate and said drain and source terminals coupled together.

7. The nonvolatile memory cell of claim 6, wherein:
said first control capacitor structure further comprises a well terminal coupled to said source terminal of said first control capacitor structure.

8. The nonvolatile memory cell of claim 7, wherein:
said first tunneling capacitor structure comprises a pFET having gate, source and drain terminals, said gate terminal coupled to said first floating gate and said drain and source terminals coupled together.

9. The nonvolatile memory cell of claim 8, wherein:
said first control capacitor structure further comprises a well terminal coupled to said source terminal of said first control capacitor structure.

10. The nonvolatile memory cell of claim 9, wherein:
said first tunneling capacitor structure further comprises a well terminal coupled to said source terminal of said first tunneling capacitor structure.

11. The nonvolatile memory cell of claim 4, wherein:
said first tunneling capacitor structure comprises a pFET having gate, source and drain terminals, said gate terminal coupled to said first floating gate and said drain and source terminals coupled together.

12. The nonvolatile memory cell of claim 8, wherein:
said first tunneling capacitor structure further comprises a well terminal coupled to said source terminal of said first tunneling capacitor structure.

13. The nonvolatile memory cell of claim 4, further comprising:
a current sense amplifier coupled to receive a current from said drain of said first pFET.

14. The nonvolatile memory cell of claim 4, further comprising:
a first hysteresis circuit coupled to said source of said first pFET, said drain of said first pFET and to a first hysteresis control node, said first hysteresis circuit responsive to a first hysteresis enable signal applied to said first hysteresis control node to modify a first current at a first node coupled to both said drain of said first pFET and to said first hysteresis circuit.

15. The nonvolatile memory cell of claim 4, further comprising:
a second pFET having gate, source and drain terminals, said gate terminal coupled to a fixed voltage source and said source terminal coupled to a Vdd voltage supply node.

16. The nonvolatile memory cell of claim 4, further comprising:
a first high-voltage switch circuit responsive to charge stored on said first floating gate for providing a first switched high-voltage output signal at a first high-voltage output node.

17. The cell of claim 1, wherein:
at least one of the control capacitor structure and the first tunneling capacitor structure includes a well, a gate and one of a source and a drain coupled to the well.

18. The nonvolatile memory cell of claim 1, wherein:
said first control capacitor structure comprises a pFET having gate, source and drain terminals, said gate terminal coupled to said first floating gate and said drain and source terminals coupled together.

19. The nonvolatile memory cell of claim 18, wherein:
said first control capacitor structure further comprises a well terminal coupled to said source terminal of said first control capacitor structure.

20. The nonvolatile memory cell of claim 18, wherein:
said first tunneling capacitor structure comprises a pFET having gate, source and drain terminals, said gate terminal coupled to said first floating gate and said drain and source terminals coupled together.

21. The nonvolatile memory cell of claim 20, wherein:
said first control capacitor structure further comprises a well terminal coupled to said source terminal of said first control capacitor structure.

22. The nonvolatile memory cell of claim 21, wherein:
said first tunneling capacitor structure further comprises a well terminal coupled to said source terminal of said first tunneling capacitor structure.

23. The nonvolatile memory cell of claim 1, wherein:
said first tunneling capacitor structure comprises a pFET having gate, source and drain terminals, said gate terminal coupled to said first floating gate and said drain and source terminals coupled together.

24. The nonvolatile memory cell of claim 23, wherein:
said first tunneling capacitor structure further comprises a well terminal coupled to said source terminal of said first tunneling capacitor structure.

25. The nonvolatile memory cell of claim 1, wherein:
a control capacitance disposed across said first control capacitor structure exceeds by a factor of at least two a tunneling capacitance disposed across said first tunneling capacitor structure.

26. The nonvolatile memory cell of claim 25, wherein:
said first pFET further comprises a well terminal coupled to said Vdd voltage supply node.

27. The nonvolatile memory cell of claim 25, wherein:
said first control capacitor structure comprises a pFET having gate, source and drain terminals, said gate terminal coupled to said first floating gate and said drain and source terminals coupled together.

28. The nonvolatile memory cell of claim 27, wherein:
said first control capacitor structure further comprises a well terminal coupled to said source terminal of said first control capacitor structure.

29. The nonvolatile memory cell of claim 27, wherein:
said first tunneling capacitor structure comprises a pFET having gate, source and drain terminals, said gate terminal coupled to said first floating gate and said drain and source terminals coupled together.

30. The nonvolatile memory cell of claim 29, wherein:
said first control capacitor structure further comprises a well terminal coupled to said source terminal of said first control capacitor structure.

31. The nonvolatile memory cell of claim 30, wherein:
said first tunneling capacitor structure further comprises a well terminal coupled to said source terminal of said first tunneling capacitor structure.

32. The nonvolatile memory cell of claim 25, wherein:
said first tunneling capacitor structure comprises a pFET having gate, source and drain terminals, said gate terminal coupled to said first floating gate and said drain and source terminals coupled together.

33. The nonvolatile memory cell of claim 32, wherein:
said first tunneling capacitor structure further comprises a well terminal coupled to said source terminal of said first tunneling capacitor structure.

34. The nonvolatile memory cell of claim 25, further comprising:
a current sense amplifier coupled to receive a current from said drain of said first pFET.

35. The nonvolatile memory cell of claim 25, further comprising:
a first hysteresis circuit coupled to said source of said first pFET, said drain of said first pFET and to a first hysteresis control node, said first hysteresis circuit responsive to a first hysteresis enable signal applied to said first hysteresis control node to modify a first current at a first node coupled to both said drain of said first pFET and to said first hysteresis circuit.

36. The nonvolatile memory cell of claim 25, further comprising:
a second pFET having gate, source and drain terminals, said gate terminal coupled to a fixed voltage source and said source terminal coupled to a Vdd voltage supply node.

37. The nonvolatile memory cell of claim 25, further comprising:
a first high-voltage switch circuit responsive to charge stored on said first floating gate for providing a first switched high-voltage output signal at a first high-voltage output node.

38. The nonvolatile memory cell of claim 1, further comprising:
a current sense amplifier coupled to receive a current from said drain of said first pFET.

39. The nonvolatile memory cell of claim 1, further comprising:
a first hysteresis circuit coupled to said source of said first pFET, said drain of said first pFET and to a first hysteresis control node, said first hysteresis circuit responsive to a first hysteresis enable signal applied to said first hysteresis control node to modify a first current at a first node coupled to both said drain of said first pFET and to said first hysteresis circuit.

40. The nonvolatile memory cell of claim 1, further comprising:
a second pFET having gate, source and drain terminals, said gate terminal coupled to a fixed voltage source and said source terminal coupled to a Vdd voltage supply node.

41. The nonvolatile memory cell of claim 1, further comprising:
a first high-voltage switch circuit responsive to charge stored on said first floating gate for providing a first switched high-voltage output signal at a first high-voltage output node.

42. A circuit comprising:
a floating gate;
a pFET having gate, drain and source terminals, said gate terminal coupled to said floating gate; and
a hysteresis circuit coupled to said source, drain and to a first hysteresis control node, said hysteresis circuit responsive to a hysteresis enable signal applied to said hysteresis control node to modify a current at a node coupled to both said drain and to said hysteresis circuit.

43. A circuit comprising:
a floating gate;
a pFET having gate, drain and source terminals, said gate terminal coupled to said floating gate;
a readout control switch coupled to the drain, responsive to a readout control signal, and providing a readout current at an output node in response to said readout control signal enabling said readout control switch to conduct from said drain to said output node; and
a hysteresis circuit coupled to said output node and to a first hysteresis control node, said hysteresis circuit responsive to a hysteresis enable signal applied to said hysteresis control node to modify a current at a node coupled to both said output node and to said hysteresis circuit.

44. A nonvolatile memory cell, comprising:
a first floating gate;
a second floating gate;
a first pFET having gate, source and drain terminals, said gate terminal coupled to said first floating gate;

a second pFET having ate, source and drain terminals, said gate terminal coupled to said second floating gate;

a first control capacitor structure having a first terminal coupled to a first voltage supply node and a second terminal coupled to said first floating gate;

a first tunneling capacitor structure having a first terminal coupled to a second voltage supply node and a second terminal coupled to said first floating gate;

a second control capacitor structure having a first terminal coupled to the second voltage supply node and a second terminal coupled to said second floating gate, a second tunneling capacitor structure having a first terminal coupled to the first voltage supply node and a second terminal coupled to said second floating gate, a first readout switch coupled between said drain of said first pFET and a first readout node, a control node of said first readout switch coupled to a source of a readout enable signal; and a second readout switch coupled between said drain of said second pFET and a second readout node, a control node of said second readout switch coupled to the source of the readout enable signal.

45. The nonvolatile memory cell of claim 44, further comprising:

a Vdd voltage supply node having a direct electrical connection to said source terminals of said first and second pFETs.

46. The nonvolatile memory cell of claim 44, wherein:

said first and second pFETs further comprise well terminals coupled to said Vdd voltage supply node.

47. The nonvolatile memory cell of claim 44, wherein:

said first control capacitor structure comprises a pFET having gate, source and drain terminals, said gate terminal coupled to said first floating gate and said drain and source terminals coupled together; and said second control capacitor structure comprises a pFET having gate, source and drain terminals, said gate terminal coupled to said second floating gate and said drain and source terminals coupled together.

48. The nonvolatile memory cell of claim 47, wherein:

said first control capacitor structure further comprises a well terminal coupled to said source terminal of said first control capacitor structure; and said second control capacitor structure further comprises a well terminal coupled to said source terminal of said second control capacitor structure.

49. The nonvolatile memory cell of claim 47, wherein:

said first tunneling capacitor structure comprises a pFET having gate, source and drain terminals, said gate terminal coupled to said first floating gate and said drain and source terminals coupled together; and said second tunneling capacitor structure comprises a pFET having gate, source and drain terminals, said gate terminal coupled to said second floating gate and said drain and source terminals coupled together.

50. The nonvolatile memory cell of claim 49, wherein:

said first control capacitor structure further comprises a well terminal coupled to said source terminal of said first control capacitor structure; and said second control capacitor structure further comprises a well terminal coupled to said source terminal of said second control capacitor structure.

51. The nonvolatile memory cell of claim 50, wherein:

said first tunneling capacitor structure further comprises a well terminal coupled to said source terminal of said first tunneling capacitor structure; and said second tunneling capacitor structure further comprises a well terminal coupled to said source terminal of said second tunneling capacitor structure.

52. The nonvolatile memory cell of claim 44, wherein:

said first tunneling capacitor structure comprises a pFET having gate, source and drain terminals, said gate terminal coupled to said first floating gate and said drain and source terminals coupled together; and said second tunneling capacitor structure comprises a pFET having gate, source and drain terminals, said gate terminal coupled to said second floating gate and said drain and source terminals coupled together.

53. The nonvolatile memory cell of claim 52, wherein:

said first tunneling capacitor structure further comprises a well terminal coupled to said source terminal of said first tunneling capacitor structure; and said second tunneling capacitor structure further comprises a well terminal coupled to said source terminal of said second tunneling capacitor structure.

54. The nonvolatile memory cell of claim 44, wherein:

a first control capacitance between said first terminal of said first control capacitor structure and said second terminal of said first control capacitor structure exceeds a first remaining capacitance comprised of a first tunneling capacitance between said first terminal of said first tunneling capacitor structure and said second terminal of said first tunneling capacitor structure and first other capacitance between said first floating gate and other nodes of the nonvolatile memory cell; and a second control capacitance between said first terminal of said second control capacitor structure and said second terminal of said second control capacitor structure exceeds a second remaining capacitance comprised of a second tunneling capacitance between said first terminal of said second tunneling capacitor structure and said second terminal of said second tunneling capacitor structure and second other capacitance between said second floating gate and other nodes of the nonvolatile memory cell.

55. The nonvolatile memory cell of claim 54, wherein:

said first pFET further comprises a well terminal coupled to said Vdd voltage supply node; and said second pFET further comprises a well terminal coupled to said Vdd voltage supply node.

56. The nonvolatile memory cell of claim 54, wherein:

said first control capacitor structure comprises a pFET having gate, source and drain terminals, said gate terminal coupled to said first floating gate and said drain and source terminals coupled together; and said second control capacitor structure comprises a pFET having gate, source and drain terminals, said gate terminal coupled to said second floating gate and said drain and source terminals coupled together.

57. The nonvolatile memory cell of claim 56, wherein:

said first control capacitor structure further comprises a well terminal coupled to said source terminal of said first control capacitor structure and said second control capacitor structure further comprises a well terminal coupled to said source terminal of said second control capacitor structure.

58. The nonvolatile memory cell of claim 56, wherein:

said first tunneling capacitor structure comprises a pFET having gate, source and drain terminals, said gate terminal coupled to said first floating gate and said drain and source terminals coupled together; and said second tunneling capacitor structure comprises a pFET having gate, source and drain terminals, said gate terminal coupled to said second floating gate and said drain and source terminals coupled together.

59. The nonvolatile memory cell of claim 58, wherein:
said first control capacitor structure further comprises a well terminal coupled to said source terminal of said first control capacitor structure; and
said second control capacitor structure further comprises a well terminal coupled to said source terminal of said second control capacitor structure.

60. The nonvolatile memory cell of claim 59, wherein:
said first tunneling capacitor structure further comprises a well terminal coupled to said source terminal of said first tunneling capacitor structure; and
said second tunneling capacitor structure further comprises a well terminal coupled to said source terminal of said second tunneling capacitor structure.

61. The nonvolatile memory cell of claim 54, wherein:
said first tunneling capacitor structure comprises a pFET having gate, source and drain terminals, said gate terminal coupled to said first floating gate and said drain and source terminals coupled together; and
said second tunneling capacitor structure comprises a pFET having gate, source and drain terminals, said gate terminal coupled to said second floating gate and said drain and source terminals coupled together.

62. The nonvolatile memory cell of claim 61, wherein:
said first tunneling capacitor structure further comprises a well terminal coupled to said source terminal of said first tunneling capacitor structure; and
said second tunneling capacitor structure further comprises a well terminal coupled to said source terminal of said second tunneling capacitor structure.

63. The nonvolatile memory cell of claim 54, further comprising:
a differential current sense amplifier coupled to receive currents from said drains of said first and second pFETs.

64. The nonvolatile memory cell of claim 54, further comprising:
a first hysteresis circuit coupled to said source of said first pFET, said drain of said first pFET and to a first hysteresis control node, said first hysteresis control circuit responsive to a first hysteresis enable signal applied to said first hysteresis control node to modify a first current at a first node coupled to both said drain of said first pFET and to said first hysteresis circuit; and
a second hysteresis circuit coupled to said source of said second pFET, said drain of said second pFET and to a second hysteresis control node, said second hysteresis control circuit responsive to a second hysteresis enable signal applied to said second hysteresis control node to modify a second current at a second node coupled to both said drain of said second pFET and to said second hysteresis circuit.

65. The nonvolatile memory cell of claim 54, further comprising:
a first high-voltage switch circuit responsive to charge stored on said first floating gate for providing a first switched high-voltage output signal at a first high-voltage output node; and
a second high-voltage switch circuit responsive to charge stored on said second floating gate for providing a second switched high-voltage output signal at a second high-voltage output node.

66. The nonvolatile memory cell of claim 44, wherein:
a first control capacitance across said first control capacitor structure exceeds by a factor of at least two a first tunneling capacitance across said first tunneling capacitor structure; and
a second control capacitance across said second control capacitor structure exceeds by a factor of at least two a second tunneling capacitance across said second tunneling capacitor structure.

67. The nonvolatile memory cell of claim 66, wherein:
said first pFET further comprises a well terminal coupled to said Vdd voltage supply node; and
said second pFET further comprises a well terminal coupled to said Vdd voltage supply node.

68. The nonvolatile memory cell of claim 66, wherein:
said first control capacitor structure comprises a pFET having gate, source and drain terminals, said gate terminal coupled to said first floating gate and said drain and source terminals coupled together; and
said second control capacitor structure comprises a pFET having gate, source and drain terminals, said gate terminal coupled to said second floating gate and said drain and source terminals coupled together.

69. The nonvolatile memory cell of claim 68, wherein:
said first control capacitor structure further comprises a well terminal coupled to said source terminal of said first control capacitor structure; and
said second control capacitor structure further comprises a well terminal coupled to said source terminal of said second control capacitor structure.

70. The nonvolatile memory cell of claim 69, wherein:
said first tunneling capacitor structure comprises a pFET having gate, source and drain terminals, said gate terminal coupled to said first floating gate and said drain and source terminals coupled together; and
said second tunneling capacitor structure comprises a pFET having gate, source and drain terminals, said gate terminal coupled to said second floating gate and said drain and source terminals coupled together.

71. The nonvolatile memory cell of claim 70, wherein:
said first control capacitor structure further comprises a well terminal coupled to said source terminal of said first control capacitor structure; and
said second control capacitor structure further comprises a well terminal coupled to said source terminal of said second control capacitor structure.

72. The nonvolatile memory cell of claim 71, wherein:
said first tunneling capacitor structure further comprises a well terminal coupled to said source terminal of said first tunneling capacitor structure; and
said second tunneling capacitor structure further comprises a well terminal coupled to said source terminal of said second tunneling capacitor structure.

73. The nonvolatile memory cell of claim 66, wherein:
said first tunneling capacitor structure comprises a pFET having gate, source and drain terminals, said gate terminal coupled to said first floating gate and said drain and source terminals coupled together; and
said second tunneling capacitor structure comprises a pFET having gate, source and drain terminals, said gate terminal coupled to said second floating gate and said drain and source terminals coupled together.

74. The nonvolatile memory cell of claim 73, wherein:
said first tunneling capacitor structure further comprises a well terminal coupled to said source terminal of said first tunneling capacitor structure; and said second tunneling capacitor structure further comprises a well terminal coupled to said source terminal of said second tunneling capacitor structure.

75. The nonvolatile memory cell of claim 66, further comprising:
a differential current sense amplifier coupled to receive currents from said drains of said first and second pFETs.

76. The nonvolatile memory cell of claim 66, further comprising:
a first hysteresis circuit coupled to said source of said first pFET, said drain of said first pFET and to a first hysteresis control node, said first hysteresis control circuit responsive to a first hysteresis enable signal applied to said first hysteresis control node to modify a first current at a first node coupled to both said drain of said first pFET and to said first hysteresis circuit; and
a second hysteresis circuit coupled to said source of said second pFET, said drain of said second pFET and to a second hysteresis control node, said second hysteresis control circuit responsive to a second hysteresis enable signal applied to said second hysteresis control node to modify a second current at a second node coupled to both said drain of said second pFET and to said second hysteresis circuit.

77. The nonvolatile memory cell of claim 66, further comprising:
a first high-voltage switch circuit responsive to charge stored on said first floating gate for providing a first switched high-voltage output signal at a first high-voltage output node; and
a second high-voltage switch circuit responsive to charge stored on said second floating gate for providing a second switched high-voltage output signal at a second high-voltage output node.

78. The nonvolatile memory cell of claim 44, further comprising:
a differential current sense amplifier coupled to receive currents from said drains of said first and second pFETs.

79. The nonvolatile memory cell of claim 44, further comprising:
a first hysteresis circuit coupled to said source of said first pFET, said drain of said first pFET and to a first hysteresis control node, said first hysteresis control circuit responsive to a first hysteresis enable signal applied to said first hysteresis control node to modify a first current at a first node coupled to both said drain of said first pFET and to said first hysteresis circuit; and
a second hysteresis circuit coupled to said source of said second pFET, said drain of said second pFET and to a second hysteresis control node, said second hysteresis control circuit responsive to a second hysteresis enable signal applied to said second hysteresis control node to modify a second current at a second node coupled to both said drain of said second pFET and to said second hysteresis circuit.

80. The nonvolatile memory cell of claim 44, further comprising:
a first high-voltage switch circuit responsive to charge stored on said first floating gate for providing a first switched high-voltage output signal at a first high-voltage output node; and
a second high-voltage switch circuit responsive to charge stored on said second floating gate for providing a second switched high-voltage output signal at a second high-voltage output node.

81. A nonvolatile memory cell, comprising:
a first floating gate;
a second floating gate;
a first pFET having gate, source, well and drain terminals, said gate terminal coupled to said first floating gate;
a second pFET having gate, source, well and drain terminals, said gate terminal coupled to said second floating gate;
a first control capacitor structure of a first capacitance having a first terminal coupled to a first voltage supply node and a second terminal coupled to said first floating gate;
a first tunneling capacitor structure of a second capacitance having a first terminal coupled to a second voltage supply node and a second terminal coupled to said first floating gate;
a second control capacitor structure of a third capacitance having a first terminal coupled to the second voltage supply node and a second terminal coupled to said second floating gate;
a second tunneling capacitor structure of a fourth capacitance having a first terminal coupled to the first voltage supply node and a second terminal coupled to said second floating gate; and
a Vdd voltage supply node having a direct electrical connection to said source and well terminals of said first and second pFETs.

82. The memory cell of claim 81, further comprising:
a first high-voltage switch circuit responsive to charge stored on said first floating gate for providing a first switched high-voltage output signal at a first high-voltage output node; and
a second high-voltage switch circuit responsive to charge stored on said second floating gate for providing a second switched high-voltage output signal at a second high-voltage output node.

83. The nonvolatile memory cell of claim 82, further comprising:
a first readout switch coupled between said drain of said first pFET and a first readout node, a control node of said first readout switch coupled to a source of a readout enable signal; and
a second readout switch coupled between said drain of said second pFET and a second readout node, a control node of said second readout switch coupled to the source of the readout enable signal.

84. The nonvolatile memory cell of claim 83, further comprising:
a differential current sense amplifier having a first input terminal coupled to said first readout node and a second input terminal coupled to said second readout node.

85. The nonvolatile memory cell of claim 82, further comprising:
a first hysteresis circuit coupled to said source of said first pFET, said drain of said first pFET at a first readout node and to a first hysteresis control node, said first hysteresis control circuit responsive to a first hysteresis enable signal applied to said first hysteresis control node to modify a first current at the first readout node coupled to both said drain of said first pFET and to said first hysteresis circuit; and
a second hysteresis circuit coupled to said source of said second pFET, said drain of said second pFET at a second readout node and to a second hysteresis control node, said second hysteresis control circuit responsive to a second hysteresis enable signal applied to said second hysteresis control node to modify a second current at the second readout node coupled to both said drain of said second pFET and to said second hysteresis circuit.

86. The nonvolatile memory cell of claim 85, further comprising:
a differential current sense amplifier having a first input terminal coupled to said first readout node and a second input terminal coupled to said second readout node.

87. The nonvolatile memory cell of claim 86, further comprising:
a first readout switch disposed to selectively interrupt current flowing from said first readout node to said first input terminal of said differential current sense amplifier, a control terminal of said first readout switch coupled to a source of a readout enable signal, the readout enable signal controlling the selective interruption of current flow in said first readout switch; and
a second readout switch disposed to selectively interrupt current flowing from said second readout node to said second input terminal of said differential current sense amplifier, a control terminal of said second readout switch coupled to a source of the readout enable signal, the readout enable signal controlling the selective interruption of current flow in said second readout switch.

88. The nonvolatile memory cell of claim 81 wherein said first and second control capacitor structures and said first and second tunneling capacitor structures are formed of pFETs having their respective source, drain and well terminals shorted to form a first terminal and their gate terminal forming a second terminal coupled to said respective floating gate.

89. The nonvolatile memory cell of claim 88, further comprising:
a first readout switch coupled between said drain of said first pFET and a first readout node, a control node of said first readout switch coupled to a source of a readout enable signal; and
a second readout switch coupled between said drain of said second pFET and a second readout node, a control node of said second readout switch coupled to the source of the readout enable signal.

90. The nonvolatile memory cell of claim 89, further comprising:
a differential current sense amplifier having a first input terminal coupled to said first readout node and a second input terminal coupled to said second readout node.

91. The nonvolatile memory cell of claim 88, further comprising:
a first hysteresis circuit coupled to said source of said first pFET, said drain of said first pFET at a first readout node and to a first hysteresis control node, said first hysteresis control circuit responsive to a first hysteresis enable signal applied to said first hysteresis control node to modify a first current at the first readout node coupled to both said drain of said first pFET and to said first hysteresis circuit; and
a second hysteresis circuit coupled to said source of said second pFET, said drain of said second pFET at a second readout node and to a second hysteresis control node, said second hysteresis control circuit responsive to a second hysteresis enable signal applied to said second hysteresis control node to modify a second current at the second readout node coupled to both said drain of said second pFET and to said second hysteresis circuit.

92. The nonvolatile memory cell of claim 91, further comprising:
a differential current sense amplifier having a first input terminal coupled to said first readout node and a second input terminal coupled to said second readout node.

93. The nonvolatile memory cell of claim 92, further comprising:
a first readout switch disposed to selectively interrupt current flowing from said first readout node to said first input terminal of said differential current sense amplifier, a control terminal of said first readout switch coupled to a source of a readout enable signal, the readout enable signal controlling the selective interruption of current flow in said first readout switch; and
a second readout switch disposed to selectively interrupt current flowing from said second readout node to said second input terminal of said differential current sense amplifier, a control terminal of said second readout switch coupled to a source of the readout enable signal, the readout enable signal controlling the selective interruption of current flow in said second readout switch.

94. The nonvolatile memory cell of claim 81, further comprising:
a first readout switch coupled between said drain of said first pFET and a first readout node, a control node of said first readout switch coupled to a source of a readout enable signal; and
a second readout switch coupled between said drain of said second pFET and a second readout node, a control node of said second readout switch coupled to the source of the readout enable signal.

95. The nonvolatile memory cell of claim 94, further comprising:
a differential current sense amplifier having a first input terminal coupled to said first readout node and a second input terminal coupled to said second readout node.

96. The nonvolatile memory cell of claim 81, further comprising:
a first hysteresis circuit coupled to said source of said first pFET, said drain of said first pFET at a first readout node and to a first hysteresis control node, said first hysteresis control circuit responsive to a first hysteresis enable signal applied to said first hysteresis control node to modify a first current at the first readout node coupled to both said drain of said first pFET and to said first hysteresis circuit; and
a second hysteresis circuit coupled to said source of said second pFET, said drain of said second pFET at a second readout node and to a second hysteresis control node, said second hysteresis control circuit responsive to a second hysteresis enable signal applied to said second hysteresis control node to modify a second current at the second readout node coupled to both said drain of said second pFET and to said second hysteresis circuit.

97. The nonvolatile memory cell of claim 96, further comprising:
a differential current sense amplifier having a first input terminal coupled to said first readout node and a second input terminal coupled to said second readout node.

98. The nonvolatile memory cell of claim 97, further comprising:
a first readout switch disposed to selectively interrupt current flowing from said first readout node to said first input terminal of said differential current sense amplifier, a control terminal of said first readout switch coupled to a source of a readout enable signal, the readout enable signal controlling the selective interruption of current flow in said first readout switch; and a second readout switch disposed to selectively interrupt current flowing from said second readout node to said second input terminal of said differential current sense amplifier, a control terminal of said second readout switch coupled to a source of the readout enable signal, the readout enable signal controlling the selective interruption of current flow in said second readout switch.

99. An array of differential pFET nonvolatile memory cells arranged in rows and columns of cells, said array comprising:

a source of VDD provided to each cell;

a row of cells having row control signals distributed to the cells of the row, the row control signals including tunneling control signals, row enable signals and row select signals; and a column of cells having column control signals distributed to the cells of a column, the column control signals including a first and a second data signal for each cell, wherein each cell includes a first floating gate and a second floating gate, the first floating gate being coupled to a gate of a first pFET readout transistor and to a first terminal of a first control capacitor structure and to a first terminal of a first tunneling capacitor structure and the second floating gate being coupled to a gate of a second pFET readout transistor and to a first terminal of a second control capacitor structure and to a first terminal of a second tunneling capacitor structure, drains of the first and second readout transistor being selectively coupled in response to said row select signals to current sense amplifiers associated with each said column of cells.

100. The array of claim 99, wherein:

a second terminal of said first control capacitor structure is coupled to a source of said first data signal for its colunm and a second terminal of said second control capacitor structure is coupled to source of said second data signal for its column.

101. The array of claim 100, wherein:

a second terminal of said first and said second tunneling capacitor structure are coupled to a source of a tunneling control signal for their row.

102. The array of claim 101, wherein:

a source of said first and said second pFET readout transistor are coupled to a source of said row enable signal for their row.

103. The array of claim 99 wherein a capacitance of said first control capacitor structure is greater than a capacitance of said first tunneling capacitor structure and a capacitance of said second control capacitor structure is greater than a capacitance of said second tunneling capacitor structure.

104. A method for programming memory cells in an array of differential pFET nonvolatile memory cells arranged in rows and columns of cells, the method comprising:

providing a source of VDD to each cell;

providing row control signals to the cells of a given row, the row control signals including tunneling control signals, row enable signals and row select signals; and providing column control signals to the cells of a given column, the column control signals including a first and a second data signal for each cell, wherein each cell includes a first floating gate and a second floating gate, the first floating gate being coupled to a gate of a first pFET readout transistor and to a first terminal of a first control capacitor structure and to a first tenriinal of a first tunneling capacitor structure and the second floating gate being coupled to a gate of a second pFET readout transistor and to a first terminal of a second control capacitor structure and to a first terminal of a second tunneling capacitor structure, drains of the first and second readout transistor being selectively coupled in response to said row select signals to current sense amplifiers associated with each said column of cells; and providing a Write Ignore tunneling control signal to non-selected cells in a column in which a selected cell is to be written, the Write Ignore tunneling control signal being approximately half of the voltage of the tunneling control signal applied to the selected cell, the Write Ignore tunneling control signal being applied while the tunneling control signal is applied to the selected cell.

105. The method of claim 104, wherein:

said tunneling control signals are voltage signals sufficient to cause Fowler-Nordheim tunneling across a dielectric insulating the first and second floating gates.

106. An apparatus for programming memory cells in an array of differential pFET nonvolatile memory cells arranged in rows and columns of cells, the apparatus comprising:

means for providing a source of VDD to each cell;

means for providing row control signals to the cells of a given row, the row control signals including tunneling control signals, row enable signals and row select signals; and means for providing column control signals to the cells of a given column, the column control signals including a first and a second data signal for each cell, wherein each cell includes a first floating gate and a second floating gate, the first floating gate being coupled to a gate of a first pFET readout transistor and to a first terminal of a first control capacitor structure and to a first terminal of a first tunneling capacitor structure and the second floating gate being coupled to a gate of a second pFET readout transistor and to a first terminal of a second control capacitor structure and to a first terminal of a second tunneling capacitor structure, drains of the first and second readout transistor being selectively coupled in response to said row select signals to current sense amplifiers associated with each said column of cells; and means for providing a Write Ignore tunneling control signal to non-selected cells in a column in which a selected cell is to be written, the Write Ignore tunneling control signal being approximately half of the voltage of the tunneling control signal applied to the selected cell, the Write Ignore tunneling control signal being applied while the tunneling control signal is applied to the selected cell.

107. The apparatus of claim 106, wherein:

said tunneling control signals are voltage signals sufficient to cause Fowler-Nordheim tunneling across a dielectric insulating the first and second floating gates.

108. A nonvolatile memory cell, comprising:

a first floating gate;

a first pFET having gate, source and drain terminals, said gate terminal coupled to said first floating gate;

a first control capacitor structure having a first terminal coupled to a first voltage supply node and a second terminal coupled to said first floating gate;

a first tunneling capacitor structure having a first terminal coupled to a second voltage supply node and a second terminal coupled to said first floating gate;
a first high-voltage switch circuit responsive to charge stored on said first floating gate for providing a first switched high-voltage output signal at a first high-voltage output node; and
a Vdd voltage supply node coupled to said source terminal of said first pFET, wherein said first pFET further comprises a well terminal coupled to said Vdd voltage supply node.

109. A nonvolatile memory cell, comprising:
a first floating gate;
a first pFET having gate, source and drain terminals, said gate terminal coupled to said first floating gate;
a first control capacitor structure having a first terminal coupled to a first voltage supply node and a second terminal coupled to said first floating gate;
a first tunneling capacitor structure having a first terminal coupled to a second voltage supply node and a second terminal coupled to said first floating gate; and
a first high-voltage switch circuit responsive to charge stored on said first floating gate for providing a first switched high-voltage output signal at a first high-voltage output node, wherein
a control capacitance disposed across said first control capacitor structure exceeds by a factor of at least two a tunneling capacitance disposed across said first tunneling capacitor structure.

110. The nonvolatile memory cell of claim 109, wherein:
said first pFET further comprises a well terminal coupled to said Vdd voltage supply node.

111. The nonvolatile memory cell of claim 109, wherein:
said first control capacitor structure comprises a pFET having gate, source and drain terminals, said gate terminal coupled to said first floating gate and said drain and source terminals coupled together.

112. The nonvolatile memory cell of claim 111, wherein:
said first control capacitor structure further comprises a well terminal coupled to said source terminal of said first control capacitor structure.

113. The nonvolatile memory cell of claim 111, wherein:
said first tunneling capacitor structure comprises a pFET having gate, source and drain terminals, said gate terminal coupled to said first floating gate and said drain and source terminals coupled together.

114. The nonvolatile memory cell of claim 113, wherein:
said first control capacitor structure further comprises a well terminal coupled to said source terminal of said first control capacitor structure.

115. The nonvolatile memory cell of claim 114, wherein:
said first tunneling capacitor structure further comprises a well terminal coupled to said source terminal of said first tunneling capacitor structure.

116. The nonvolatile memory cell of claim 109, wherein:
said first tunneling capacitor structure comprises a pFET having gate, source and drain terminals, said gate terminal coupled to said first floating gate and said drain and source terminals coupled together.

117. The nonvolatile memory cell of claim 116, wherein:
said first tunneling capacitor structure further comprises a well terminal coupled to said source terminal of said first tunneling capacitor structure.

118. The nonvolatile memory cell of claim 109, further comprising:
a current sense amplifier coupled to receive a current from said drain of said first pFET.

119. A nonvolatile memory cell, comprising:
a first floating gate;
a first pFET having gate, source and drain terminals, said gate terminal coupled to said first floating gate;
a first control capacitor structure having a first terminal coupled to a first voltage supply node and a second terminal coupled to said first floating gate;
a first tunneling capacitor structure having a first terminal coupled to a second voltage supply node and a second terminal coupled to said first floating gate;
a first high-voltage switch circuit responsive to charge stored on said first floating gate for providing a first switched high-voltage output signal at a first high-voltage output node and
a Vdd voltage supply node coupled to said source terminal of said first pFET wherein
a control capacitance disposed between said first terminal of said first control capacitor structure and said second terminal of said first control capacitor structure exceeds a remaining capacitance comprised of a tunneling capacitance between said first terminal of said first tunneling capacitor structure and said second terminal of said first tunneling capacitor structure and other capacitance between said first floating gate and other nodes of the nonvolatile memory cell.

120. The nonvolatile memory cell of claim 119, wherein:
said first pFET further comprises a well terminal coupled to said Vdd voltage supply node.

121. The nonvolatile memory cell of claim 119, wherein:
said first control capacitor structure comprises a pFET having gate, source and drain terminals, said gate terminal coupled to said first floating gate and said drain and source terminals coupled together.

122. The nonvolatile memory cell of claim 121, wherein:
said first control capacitor structure further comprises a well terminal coupled to said source terminal of said first control capacitor structure.

123. The nonvolatile memory cell of claim 122, wherein:
said first tunneling capacitor structure comprises a pFET having gate, source and drain terminals, said gate terminal coupled to said first floating gate and said drain and source terminals coupled together.

124. The nonvolatile memory cell of claim 123, wherein:
said first control capacitor structure further comprises a well terminal coupled to said source terminal of said first control capacitor structure.

125. The nonvolatile memory cell of claim 124, wherein:
said first tunneling capacitor structure further comprises a well terminal coupled to said source terminal of said first tunneling capacitor structure.

126. The nonvolatile memory cell of claim 119, wherein:
said first tunneling capacitor structure comprises a pFET having gate, source and drain terminals, said gate terminal coupled to said first floating gate and said drain and source terminals coupled together.

127. The nonvolatile memory cell of claim 126, wherein:
said first tunneling capacitor structure further comprises a well terminal coupled to said source terminal of said first tunneling capacitor structure.

128. The nonvolatile memory cell of claim 119, further comprising:
a current sense amplifier coupled to receive a current from said drain of said first pFET.

129. A nonvolatile memory cell, comprising:
a first floating gate;
a first pFET having gate, source and drain terminals, said gate terminal coupled to said first floating gate;

a first control capacitor structure having a first terminal coupled to a first voltage supply node and a second terminal coupled to said first floating gate;

a first tunneling capacitor structure having a first terminal coupled to a second voltage supply node and a second terminal coupled to said first floating gate;

a first high-voltage switch circuit responsive to charge stored on said first floating gate for providing a first switched high-voltage output signal at a first high-voltage output node; and a first readout switch coupled between said drain of said first pFET and a readout node, a control node of said readout switch coupled to a source of a readout enable signal.

* * * * *